(12) United States Patent
Zimlich et al.

(10) Patent No.: US 11,618,672 B2
(45) Date of Patent: Apr. 4, 2023

(54) SLEW RATE LIMITER SYSTEMS, DEVICES, AND METHODS

(71) Applicant: AAC Technologies Pte. Ltd., Singapore (SG)

(72) Inventors: David Zimlich, Dana Point, CA (US); Arthur S. Morris, III, Lakewood, CO (US)

(73) Assignee: AAC Technologies Pte. Ltd., Singapore (SG)

(*) Notice: Subject to any disclaimer, the term of this patent is extended or adjusted under 35 U.S.C. 154(b) by 886 days.

(21) Appl. No.: 16/558,063

(22) Filed: Aug. 31, 2019

(65) Prior Publication Data

US 2020/0071158 A1 Mar. 5, 2020

Related U.S. Application Data

(60) Provisional application No. 62/725,775, filed on Aug. 31, 2018.

(51) Int. Cl.
| | |
|---|---|
| *B81B 7/00* | (2006.01) |
| *B81B 7/02* | (2006.01) |
| *H01G 5/16* | (2006.01) |
| *H01G 5/011* | (2006.01) |
| *H02M 3/07* | (2006.01) |

(52) U.S. Cl.
CPC .............. *B81B 7/008* (2013.01); *B81B 7/02* (2013.01); *H01G 5/011* (2013.01); *H01G 5/16* (2013.01); *H02M 3/07* (2013.01)

(58) Field of Classification Search
CPC ............. B81B 7/008; B81B 7/02; H02M 3/07
See application file for complete search history.

(56) References Cited

U.S. PATENT DOCUMENTS

| | | | |
|---|---|---|---|
| 4,622,482 | A | 11/1986 | Ganger |
| 5,446,412 | A | 8/1995 | Kimyacioglu et al. |

(Continued)

FOREIGN PATENT DOCUMENTS

| | | |
|---|---|---|
| CN | 108199578 A | 6/2018 |
| WO | WO 2020/047521 A1 | 3/2020 |

OTHER PUBLICATIONS

Chinese Office Action for Application No. 201980071605 dated Feb. 16, 2022.

(Continued)

*Primary Examiner* — Kawing Chan
(74) *Attorney, Agent, or Firm* — W&G Law Group

(57) ABSTRACT

Devices, systems, and methods for limiting a slew rate of a driven device. In some embodiments, the device for limiting a slew rate of the driven device includes one or more slew rate limiting field-effect transistors (FETS) connected between a first circuit node and a node of the driven device, and a first control circuit. In some embodiments, the one or more first slew rate limiting FETs and the first control circuit are configured to set a rate at which the driven device is charged or discharged. In some embodiments, the first control circuit is within a voltage divider and the current flowing through the voltage divider is proportionally mirrored to the one or more first slew rate limiting FETs wherein the current mirror ratio is selected to ensure that a rate at which a capacitance of the driven device changes over time is below a specified limit.

23 Claims, 14 Drawing Sheets

(56) References Cited

U.S. PATENT DOCUMENTS

| | | | |
|---|---|---|---|
| 6,031,389 A | 2/2000 | Fotouhi et al. | |
| 6,429,685 B1* | 8/2002 | Stockstad | H03K 19/00384 |
| | | | 326/27 |
| 9,336,953 B2 | 5/2016 | Khieu et al. | |
| 9,467,124 B2* | 10/2016 | Crandall | H03K 3/353 |
| 9,948,212 B2 | 4/2018 | Khieu et al. | |
| 2006/0279356 A1 | 12/2006 | An | |
| 2008/0036516 A1* | 2/2008 | Fort | H03K 5/01 |
| | | | 327/170 |
| 2014/0043077 A1 | 2/2014 | Brauer et al. | |
| 2016/0072408 A1 | 3/2016 | Khieu et al. | |

OTHER PUBLICATIONS

International Search Report and Written Opinion for Application No. PCT/US2019/049244 dated Dec. 20, 2019.

\* cited by examiner

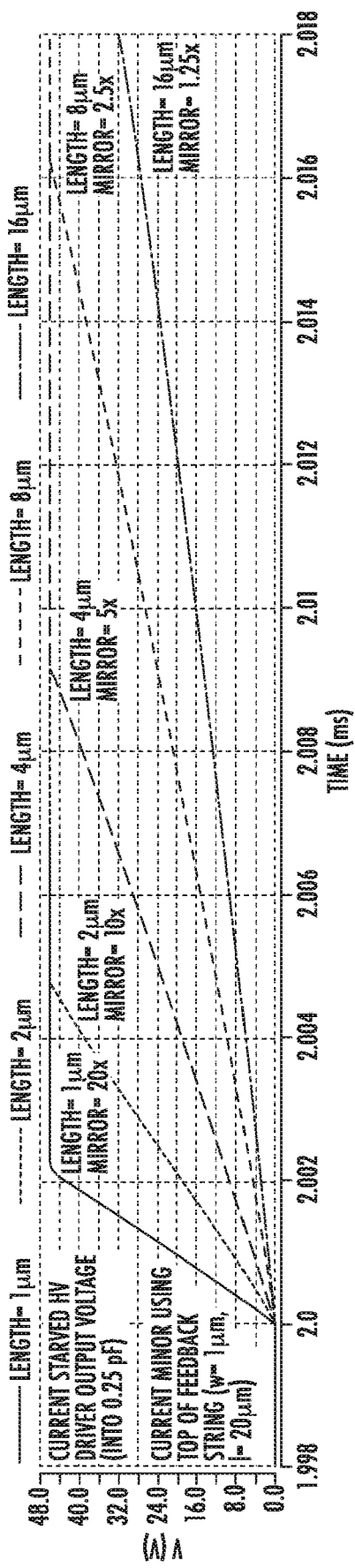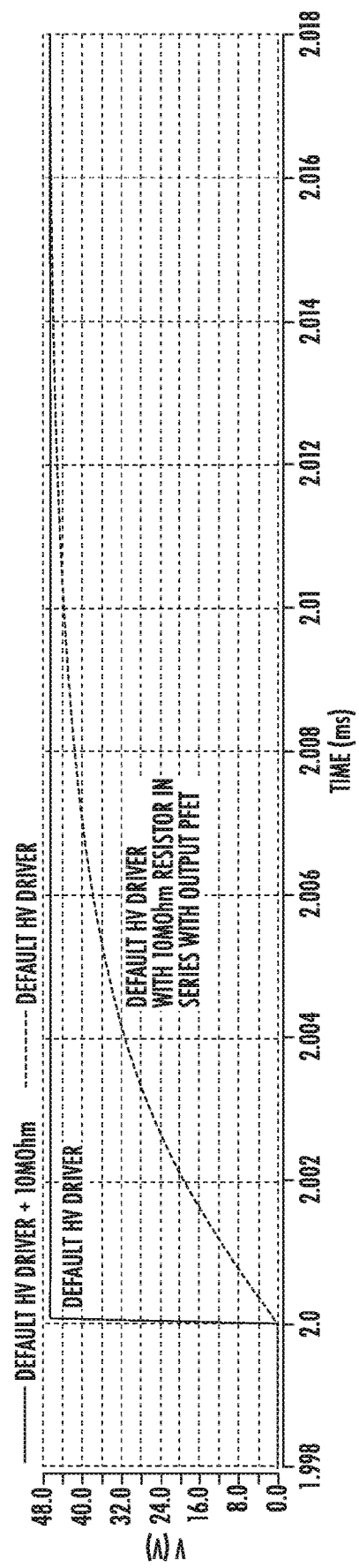

SLEW RATE LIMITER SYSTEMS, DEVICES, AND METHODS

CROSS-REFERENCE TO RELATED APPLICATION

This patent application claims priority to U.S. Provisional Patent Application Ser. No. 62/725,775, filed Aug. 31, 2018, the entire disclosure of which is incorporated by reference herein.

TECHNICAL FIELD

The subject matter disclosed herein relates generally to voltage/current supply systems, devices, and methods. More particularly, the subject matter disclosed herein relates to a control system for an electronic device.

BACKGROUND

When using electrostatic forces to control micro-electromechanical systems (MEMS) actuators or similar structures, a charge needs to be delivered to actuate the system(s). In many common configurations, this charge is supplied by selectively applying a bias voltage to the system which charges the MEMS capacitance. Traditionally, when multiple MEMS are controlled from a single power supply, the voltage required (e.g., from about 20 V to about 200 V) is applied and removed by a high voltage CMOS integrated driver. The CMOS output slew rate is typically very high, with a change in the input gate drive signal causing a nearly instantaneous charge in output voltage when compared to the actuation time of the MEMS. Thus, where I is the saturated output drive current of the CMOS device, for example and without limitation a p-channel field-effect transistor (PFET) or n-channel field-effect transistor (NFET), and C is the capacitive load (e.g., typically less than 1 pF), the slew rate (i.e., the change in voltage of the MEMs or other driven element over the change in time, dV/dt) can be represented by the relationship I/C.

For example, if the available CMOS can drive 1 mA into a short circuit (e.g. for a drain-source resistance of 40 kohms for a supply voltage of 40V), and for a MEMS actuator capacitance of 1 pF, then the MEMS voltage will change at a rate of 1 V/ns. In addition, changes in temperature and process can cause the CMOS device and thus the resulting slew rate to vary noticeably. With this rapid voltage slew rate, the MEMS actuators rapidly reach the supply voltage (40 ns in above example) much faster than the MEMS can respond mechanically (typically greater than 1 us) and thus the MEMS motion is driven with nearly constant high voltage applied. The forces rise rapidly with the MEMS motion as the MEMS actuator capacitance increases.

This condition drives rapid acceleration of the MEMS and can lead to the well-known pull-in behavior if the voltage is high enough. In some configurations, it is undesirable for the MEMS device to undergo such rapid structural changes which can cause high stresses and also high transient contact forces between MEMS elements, which can lengthen settling times and shorten lifespans of the MEMS devices and/or components thereof.

SUMMARY

In accordance with this disclosure, systems, devices, and methods for controlling an electronic device are provided. In one aspect, a driver for an electronic device is provided. The driver can include a first circuit node, a first control circuit, and one or more first slew rate limiting field-effect transistors (FETs) connected between the first circuit node and a node of the electronic device to be driven, wherein a gate of the one or more first slew rate limiting FET is connected to the first control circuit, wherein the one or more first slew rate limiting FET and the first control circuit are configured to set a rate at which the electronic device is charged or discharged. In some embodiments, the first control circuit comprises: one or more diode-connected FETs, wherein a gate of each of the one or more diode-connected FETs is connected to the gate of a corresponding one of the one or more first slew rate limiting FETs; wherein a source of one of the one or more diode-connected FETs is connected to the first circuit node; wherein a drain of one of the one or more diode-connected FETs is common with the gate of the one of the one or more diode-connected FETs; wherein the first control circuit is a part of a current source circuit; and wherein a current in the current source circuit is mirrored to set a proportional current in the one or more first slew rate limiting FETs.

In some embodiments each of the one or more first slew rate limiting FETs has a gate width and a gate length that are selected relative to a gate width and gate length, respectively, of the corresponding one of the one or more diode-connected FETs to set a current mirror ratio of the one or more first slew rate limiting FETs; and a first current flowing through the one or more first slew rate limiting FETs is proportional, according to the current mirror ratio, to a second current flowing through the corresponding one of the one or more diode-connected FETs.

In another aspect, a method for controlling a rate at which an electronic device is charged is provided. In some embodiments, the method comprises applying a voltage to a first circuit node; connecting one or more first slew rate limiting field-effect transistors (FETs) between the first circuit node and a node of the electronic device to be driven; connecting a gate of the one or more first slew rate limiting FETs to a first control circuit; and charging or discharging the electronic device through the one or more first slew rate limiting FET using the first control circuit. In some embodiments, the first control circuit comprises: one or more diode-connected FETs, wherein a gate of each of the one or more diode-connected FETs is connected to the gate of a corresponding one of the one or more first slew rate limiting FETs; wherein a source of one of the one or more diode-connected FETs is connected to the first circuit node; wherein a drain of one of the one or more diode-connected FETs is common with the gate of the one of the one or more diode-connected FETs; and wherein the first control circuit is a part of a current source circuit, the method further comprising: mirroring a current in the current source circuit to set a proportional current in the one or more first slew rate limiting FETs.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which:

FIGS. 4A and 4B are graphs illustrating voltage output over time for a voltage supply circuit for an electronic device according to various embodiments of the presently disclosed subject matter;

DETAILED DESCRIPTION

Figure 1A:
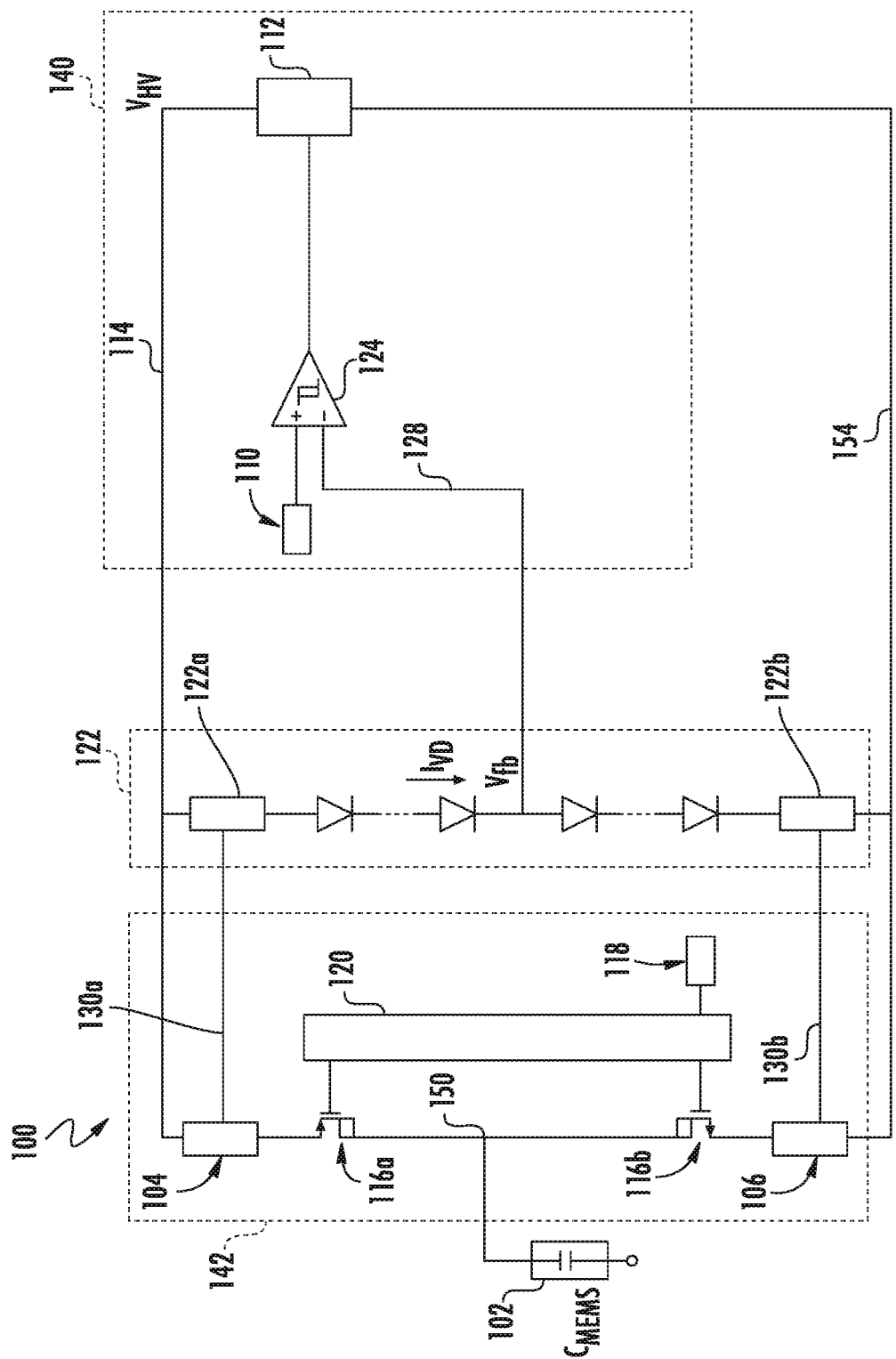
FIGS. 1A-1G, 2, and 3 are schematic representations of a driver circuit for an electronic device according to various embodiments of the presently disclosed subject matter.

The present subject matter provides systems, devices, and methods for controlling an electronic device. In some embodiments, the present disclosure provides systems, devices, and methods for designing a self-biasing slew rate limiter. In one aspect, the present subject matter provides a high voltage power supply regulation sensing circuit that is configured to provide electrical charge to a driven device (e.g., a MEMS actuator) at a slew rate that is predictable and consistent over process corners. In semiconductor manufacturing, a process corner is an example of a design-of-experiments (DoE) technique that refers to a variation of fabrication parameters used in applying an integrated circuit design to a semiconductor wafer. Process corners represent the extremes of these parameter variations within which a circuit that has been etched onto the wafer must function correctly. A circuit running on devices fabricated at these process corners may run slower or faster than specified and at lower or higher temperatures and voltages, but if the circuit does not function at all at any of these process extremes the design is considered to have inadequate design margin. Utilizing the high voltage power supply regulation sensing circuit, a reduced and controlled slew rate drive can be provided to an actuator (e.g., a MEMS device) or other driven device to provide a lower actuation impact velocity than with the non-slew rate limited case. While this solution can still have process variations, as the current in the voltage divider string 122 string (illustrated in FIG. 1A-FIG. 1G and FIG. 3 as voltage divider 122) will vary over process, voltage, and temperature (PVT), the technique still provides significant benefits over the range of this variation.

In the description below, reference is made to a MEMS device having an "OPENED" position and a "CLOSED" position, or an "OPENED" state and a "CLOSED" state. To clarify these different states, the present disclosure defines a MEMS device having an "OPENED" position or state as a MEMS actuator with two parallel electrodes, where the electrodes are not substantially charged and are thus spaced apart from each other and not touching or not relatively close to touching, relative to a maximum distance of space allowed between the two electrodes. Additionally, in the present disclosure, a MEMS device having a "CLOSED" position is a MEMS actuator with two parallel electrodes, where the electrodes are substantially charged and are very close together or touching compared to their maximum distance of space allowed between the two electrodes. In other words, in the "CLOSED" position, the electrodes are either substantially touching or very nearly touching. And in the "OPENED" position, the electrodes are not touching and significantly further apart from each other compared to their distance from each other when the MEMS device is "CLOSED".

In this same vein, when reference is made to a MEMS device in a "CLOSED" state or position, it should be noted that the MEMS device is in a higher capacitance state relative to the capacitance of the MEMS device in an "OPENED" state or position. This is so because the movable electrode inside the MEMS device is positioned very close to the charged electrode. Those of ordinary skill in the art will appreciate that, generally, the lower the distance between the charged electrode and the movable electrode, the higher the capacitance of the MEMS device. The opposite is true when the MEMS is in the "OPEN" state. As discussed above, the electrodes are further apart and thus, due to the nature of capacitors, "OPEN" MEMS devices will have a lower capacitance.

Referring to FIG. 1A, a driver circuit 100 is illustrated, including driven element 102 (e.g. a MEMS device) being attached to the driver circuit 100 at driven element node 150. In some embodiments, the desired MEMS static operating voltage (e.g., between about 30 V and 50 V) is provided by a charging network 140. In some embodiments, the charging network 140 comprises a power supply 112 connected to a power supply node 114, for example and without limitation, a high-voltage node. Hereinbelow, when reference is made to the power supply node 114, those of ordinary skill in the art will appreciate that it can also be referred to as a high-voltage node or a low-voltage node depending on the various devices, power supplies, and other components used in the driver circuit 100. In some other embodiments, the power supply node 114 can simply be referred to as a first circuit node, depending on the various components and devices used to construct the driver circuit 100. In some embodiments, the power supply 112 comprises, for example and without limitation, a charge pump or other similar device (e.g., a battery or other power source that is externally applied as a biasing level), controlled with a bang-bang drive scheme to generate and maintain the desired high voltage. In this configuration, the power supply 112 is driven until a divided portion of the desired high voltage exceeds a reference feedback voltage 110. Hereinbelow, the voltage at the divided portion can be referred to a divided voltage, divided output voltage, or feedback voltage $V_{fb}$. In some embodiments, such as the one show in FIG. 1B, the driver circuit 100 can comprise an oscillator 108 configured to drive the power supply 112 as described hereinbelow.

Turning to FIG. 1A, in some embodiments, in order to determine if the desired high voltage exceeds the reference feedback voltage 110, a comparator 124 can be used. In some embodiments, the comparator 124 can comprise one or more processors, one or more switches, or other circuitry such as, for example and without limitation, an operational amplifier, configured to compare the feedback voltage $V_{fb}$ at the divided portion to the reference feedback voltage 110. The divided portion can be derived from a feedback network comprising a voltage divider 122 that is connected between the power supply node 114 and a second circuit node 154, for example and without limitation, a ground. Hereinbelow, when reference is made to the second circuit node 154, this node can also be referred to as a reference node or a ground because in some embodiments, the second circuit node 154 may be a node or rail that is grounded or not grounded, or instead some voltage that is substantially lower than the power supply node 114. In some embodiments, for example and without limitation, the voltage divider 122 of the feedback network can be comprised of a string of one or more diodes and/or FETS and/or PFETs and/or NFETs as shown in FIGS. 1A-1G. In some other embodiments, the voltage divider 122 can be, for example and without limitation, a string of one or more diodes, one or more diode-connected FETS and/or one or more resistors and/or one or more capacitors, or any combination thereof. In some embodiments, the voltage divider 122 can be comprised of any suitable circuitry that performs the same functions as described herein. Additionally, hereinbelow, the voltage divider 122 can be referred to as a current source circuit.

Turning to FIG. 1B again, when the voltage at the power supply node 114 (i.e., $V_{HV}$) is greater than the desired high-voltage value, the divided voltage (i.e., feedback voltage $V_{fb}$) will exceed the reference feedback voltage 110, then the oscillator 108 is configured to turn off (i.e., no longer drive the power supply 112), and $V_{HV}$ decays through one or more circuit paths to ground. Although in some embodiments, there may be any of a variety of leakage paths, in many configurations, the path of the voltage divider 122 is a dominant leakage source. When the feedback voltage $V_{fb}$ drops below the reference feedback voltage 110, implying that $V_{HV}$, or the voltage at the power supply node 114, is less than the desired high voltage value, the oscillator 108 is configured to turn on (i.e., drive the power supply 112). In some embodiments, the reference feedback voltage 110 can be selected or chosen or changed, based on the desired voltage that a user wants to compare the feedback voltage $V_{fb}$ to. In some embodiments, the reference feedback voltage 110 can be stored in a re-writable memory either inside of or separately from the comparator.

Figure 1B:
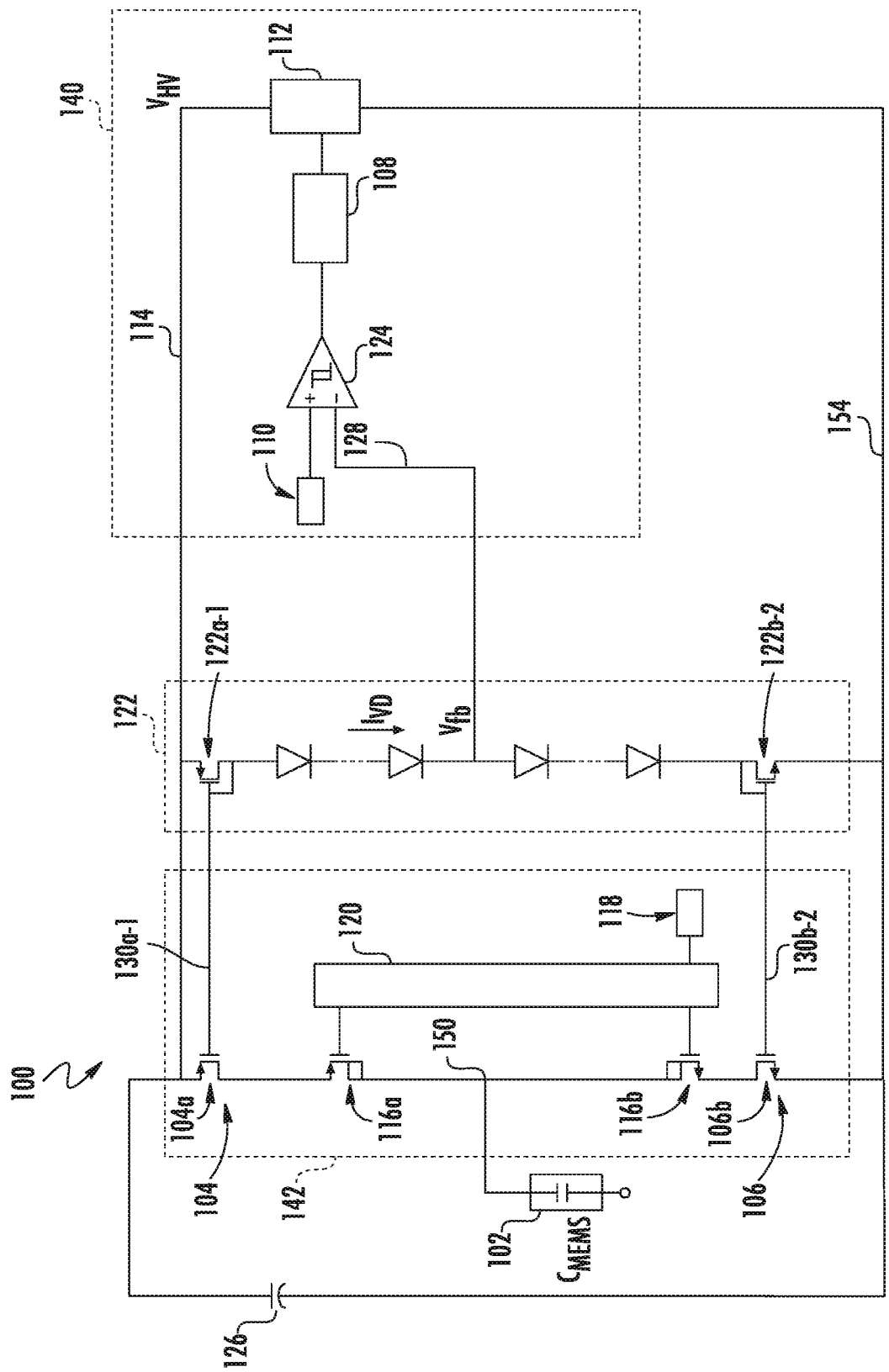

As a hypothetical to explain the above concepts, assume, for non-limiting, hypothetical purposes only, that the power supply node 114 is required or desired to be charged to about 40V. In some embodiments, the comparator 124 will not operate properly near 40V because it most likely has a threshold near the native logic threshold of the semiconductor process, but it still needs to be able to compare the voltage of the power supply node 114 with the reference feedback voltage 110 to ensure that the power supply node 114 has regulated to the desired operating voltage. In order to do this, a tap 128 that is sourced from a position on the voltage divider 122 and connects to the comparator 124 to provide the feedback voltage $V_{fb}$ to compare to the reference feedback voltage 110 is provided. As illustrated in FIG. 1B, the tap 128 providing the feedback voltage $V_{fb}$ can be placed at any position along the voltage divider 122. The key is that the tap 128 providing the feedback voltage $V_{fb}$ is placed in a position such that it provides a desired divided voltage of the power supply node 114 so that it can be compared to the reference feedback voltage 110 by the comparator 124. In some embodiments, for example and without limitation, the tap 128 can be placed between two diodes, FETS (PFETS and/or NFETS), capacitors, or resistors along the string. Furthermore, in some other embodiments, the tap 128 can be placed at the top or bottom of the voltage divider 122 or not between two diodes, FETS, or resistors. As discussed above, the voltage divider 122 can be comprised of a string of one or more diodes, one or more FETS, one or more resistors, and/or one or more capacitors, or any combination thereof. For the purposes of the hypothetical, the voltage divider 122 comprises a string of PFETS.

In this hypothetical, the voltage across each of the PFETS in the string will be determined by the voltage between the power supply nodes 114 and 154 as well as the number of PFETS in the string. For a given supply voltage, the number of PFETS in the string is chosen small enough such that the voltage across each PFET generates enough current (set by the I-V curve of the PFET) through the string for divider stability, minimizing divider size and also minimizing time constants for the divider string to respond to changes in the supply voltage. Within those constraints, the number of PFETs is chosen large enough to minimize current consumption. The comparator 124, in some embodiments, is a low voltage comparator that takes inputs of up to about 3.3V, hence the need for the tap 128 to be located at a divided portion of the voltage divider 122 and not near the top where the voltage is much higher (i.e., at or close to 40V). In a hypothetical case where the power supply node 114 is at about 40V and each PFET has a voltage drop of approximately 1V, then having the tap 128 connected between the third and fourth PFET from the second circuit node 154 will give the tap 128 a feedback voltage $V_{fb}$ of about 3V. If the reference feedback voltage 110 is set to about 3V, then the comparator 124 should receive a reference feedback voltage 110 and a feedback voltage $V_{fb}$ from the tap 128 of the same voltage (i.e., about 3V). Although this hypothetical demonstrates how the voltage divider 122 and the tap 128 as well as the comparator are used as feedback to drive the oscillator 108 and the power supply 112, it should be noted that the number of diodes and/or PFETS and/or NFETS and/or resistors in the voltage divider 122, positioning of the tap 128, and configuration of the comparator 124 and power supply node 114 can be altered or selected based on the desired voltage of the power supply node 114 and the reference feedback voltage 110 and the feedback voltage $V_{fb}$ at the tap 128 can range anywhere between about 0.5 V and 5V.

In some embodiments, hysteresis is built in so that the oscillator 108 turn-off voltage is marginally above the desired high voltage value (e.g., about 41V) and the oscillator 108 will not turn back on until $V_{HV}$, or the voltage at the power supply node 114, drops marginally below the desired high voltage value (e.g., about 39V). The power supply node 114 output can overshoot by the time the oscillator 108 drive is turned off, however, due to the time constants of the voltage divider 122 and other circuitry in the power supply 112. In each cycle, the high-voltage will decay due to divider current and leakage in the other CMOS circuitry until it gets back to the threshold. The undershoot is negligible because the decay is so much slower than the charging. In some embodiments, this hysteresis can be optimized to minimize duty cycle, power dissipation, loop delay, etc.

In some embodiments, as illustrated in FIG. 1A a first control circuit 122a comprising a subset of the devices (i.e., diodes, resistors, PFETS, NFETS, capacitors etc.) of the voltage divider 122 is connected to the slew rate limiting pull-in circuit 104 via connection 130a to provide the voltage divider current $I_{VD}$ as described further hereinbelow. In some embodiments when it is present, the first control circuit 122a is configured to help control the slew rate of the driven device 102 when the driven device is closing and/or opening. In some embodiments, the first control circuit 122a of devices (i.e., one or more diodes, resistors, PFETS, NFETS, capacitors etc.) of the voltage divider 122 is connected to the slew rate limiting pull-in circuit 104 via connection 130a and a second control circuit 122b comprising a second subset of the devices (i.e., one or more diodes, resistors, PFETS, NFETS, capacitors etc.) of the voltage divider 122 is connected to the slew rate limiting releasing circuit 106 via connection 130b to provide the voltage divider current $I_{VD}$ as described hereinbelow. In some embodiments when it is present, the second control circuit 122b is configured to help control the slew rate of the driven device 102 when the driven device is opening and/or closing. Those having ordinary skill in the art will appreciate that in the event that only slew rate limiting pull-in circuit 104 is present, it will be connected to the voltage divider 122 via connection 130a and connection 130b will not be present. The opposite is true in embodiments where only slew rate limiting releasing circuit 106 is present. In some embodiments, as discussed further hereinbelow, the slew rate limiting pull-in circuit 104 comprises one or more FETs (PFET or NFET) and the slew rate limiting releasing circuit 106 comprises one or more FETs (PFET or NFET). It should be noted that the negligible current flows in the connections 130a and 130b.

In some embodiments, the first control circuit 122a can comprise one or more devices (i.e., one or more diodes, resistors, PFETS, NFETS, capacitors etc.) and each of the one or more devices in the first control circuit 122a can have a discrete connection 130a to a corresponding FET of the slew rate limiting pull-in circuit 104. In other words, in some embodiments, there can be a one-to-one connection wherein each diode, PFET/NFET, resistors, etc. that makes up the voltage divider first control circuit 122a can be connected to a separate or different or discrete corresponding FET of the slew rate limiting pull-in circuit 104. Meaning, there can be one or more connections 130a between the first control circuit 122a and the slew rate limiting pull-in circuit 104. Similarly, in some embodiments, the second control circuit 122b can comprise one or more devices (i.e., resistors, PFETS, NFETS, etc.) and each of the one or more devices in the second control circuit 122b can have a connection 130b to a corresponding FET of the slew rate limiting releasing circuit 106. In other words, in some embodiments, there can be a one-to-one connection where each PFET/NFET that makes up the current mirror second control circuit 122b can be connected to a separate or different or discrete corresponding FET of the slew rate limiting releasing circuit 106. Meaning, there can be one or more connections 130b between the second control circuit 122b and the slew rate limiting releasing circuit 106.

In some embodiments, the physical structure, properties, or design of each device in the slew rate limiting pull-in circuit 104 is almost or substantially identical to the physical structure, properties, or design of the corresponding PFET/NFET it is connected to in the first control circuit 122a. For example and without limitation, a gate length and/or gate width of each of the devices in the slew rate limiting pull-in circuit 104 can be set to be substantially the same as a gate length and/or gate width of the corresponding device it is connected to in the first control circuit 122a. In some embodiments, the physical structure, properties, or design of each device in the slew rate limiting pull-in circuit 104 is different than the physical structure, properties, or design of the corresponding PFET/NFET it is connected to in the first control circuit 122a. For example and without limitation, a gate length and/or gate width of each of the devices in the slew rate limiting pull-in circuit 104 can be set to be different than a gate length and/or gate width of the corresponding device it is connected to in the first control circuit 122a. In some embodiments where a slew rate limiting releasing circuit 106 is included in the driver circuit 100, the physical structure, properties, or design of each device in the slew rate limiting releasing circuit 106 is almost or substantially identical to the physical structure, properties, or design of the corresponding PFET/NFET it is connected to in the second control circuit 122b. For example and without limitation, a gate length and/or gate width of each of the devices in the slew rate limiting releasing circuit 106 can be substantially the same as a gate length and/or gate width of the corresponding device it is connected to in the second control circuit 122b. In some embodiments, the physical structure, properties, or design of each device in the slew rate limiting releasing circuit 106 is different than the physical structure, properties, or design of the corresponding PFET/NFET it is connected to in the second control circuit 122b. For example and without limitation, a gate length and/or gate width of each of the devices in the slew rate limiting releasing circuit 106 can be the same as a gate length and/or gate width of the corresponding device it is connected to in the second control circuit 122b.

Thus, in some embodiments, each of the slew rate limiting pull-in circuit 104 and/or the slew rate limiting pull-in releasing circuit 106 comprise FETs having a gate width and a gate length that are selected relative to a gate width and gate length, respectively, of the corresponding FETs of the first control circuit 122a or the second control circuit 122b to set a current mirror ratio of the slew rate limiting pull-in circuit 104 or the slew rate limiting releasing circuit 106.

In some implementations of the present disclosure, it can be said that the driven device 102 has a maximum switching time and a minimum switching time. The maximum switching time is the desired switching time within which a user would want to have in their driven device 102 transition from "OPENED" to "CLOSED" and vice versa. The minimum switching time would be the minimum time that the driven device 102 can switch while still maintaining structural and other forms of reliability (i.e., no damage to the electrodes caused by impact forces). The minimum switching time can be derived from the maximum rate of change of the capacitance of an actuator of the driven device 102 and various other actuator dynamic capacitance considerations. Those having ordinary skill in the art will appreciate that the impact forces of a closing driven device 102 can cause damage to the electrodes. The impact forces of the electrodes are proportional to the electrode velocity at impact and the capacitance rate of change is proportional to the electrode velocity of the driven device 102. Thus, by limiting the rate of change of the capacitance of the driven device 102, the driver circuit 100 of the present disclosure limits the impact forces of the electrodes.

In some embodiments, the current mirror ratio of either of the slew rate limiting pull-in circuit 104 or the slew rate limiting releasing FETs 106 is selected to ensure that a time required for the connected driven device 102 to move from an "OPEN" state to a "CLOSED" state or from a "CLOSED" state to an "OPEN" state is greater than a lowest specified switching time. Moreover, in some embodiments, the current mirror ratio is selected to ensure that a rate at which the actuator capacitance of the driven device 102 changes over time is below a specified limit. In some embodiments, for example, the specified limit is equal to the change in actuator capacitance of the driven device 102 when the driver circuit does not include a slew rate limiting device.

The lowest switching time can be specified as the time it takes the driven device 102 to "OPEN" or "CLOSE" with the aid of a driver circuit 100 like one of the embodiments herein. More specifically, the lowest specified switching time is based on the speed at which the driven device opens or closes without causing material damage to the electrodes of the driven device 102. In other words, if the switching time is relatively low, then the speed at which the driven device 102 closes is relatively high. On the other hand, if the switching time for closing is higher than the lowest specified switching time (i.e., with slew rate limiting), then the closing of the driven device 102 is slower than if there was no slew rate limiting device. Thus, the lowest specified switching time, and therefore the speed at which the driven device 102 opens or closes, is dependent upon the material properties of the electrodes. If the electrodes of the driven device 102 are more durable, they can handle a higher speed and thus, a lower specified switching time and higher speed. If the electrodes of the driven device 102 are made of less durable material, they can handle only lower speeds and thus, must have a lowest specified switching time that is higher than the electrodes made of more durable materials. In any event the lowest specified switching time is set such that when the driven device 102 closes or opens, the electrodes receive physical damage due to the speed at which the device opens or closes, and if the specified switching time were any higher, then the damage would not occur.

Figure 6A:
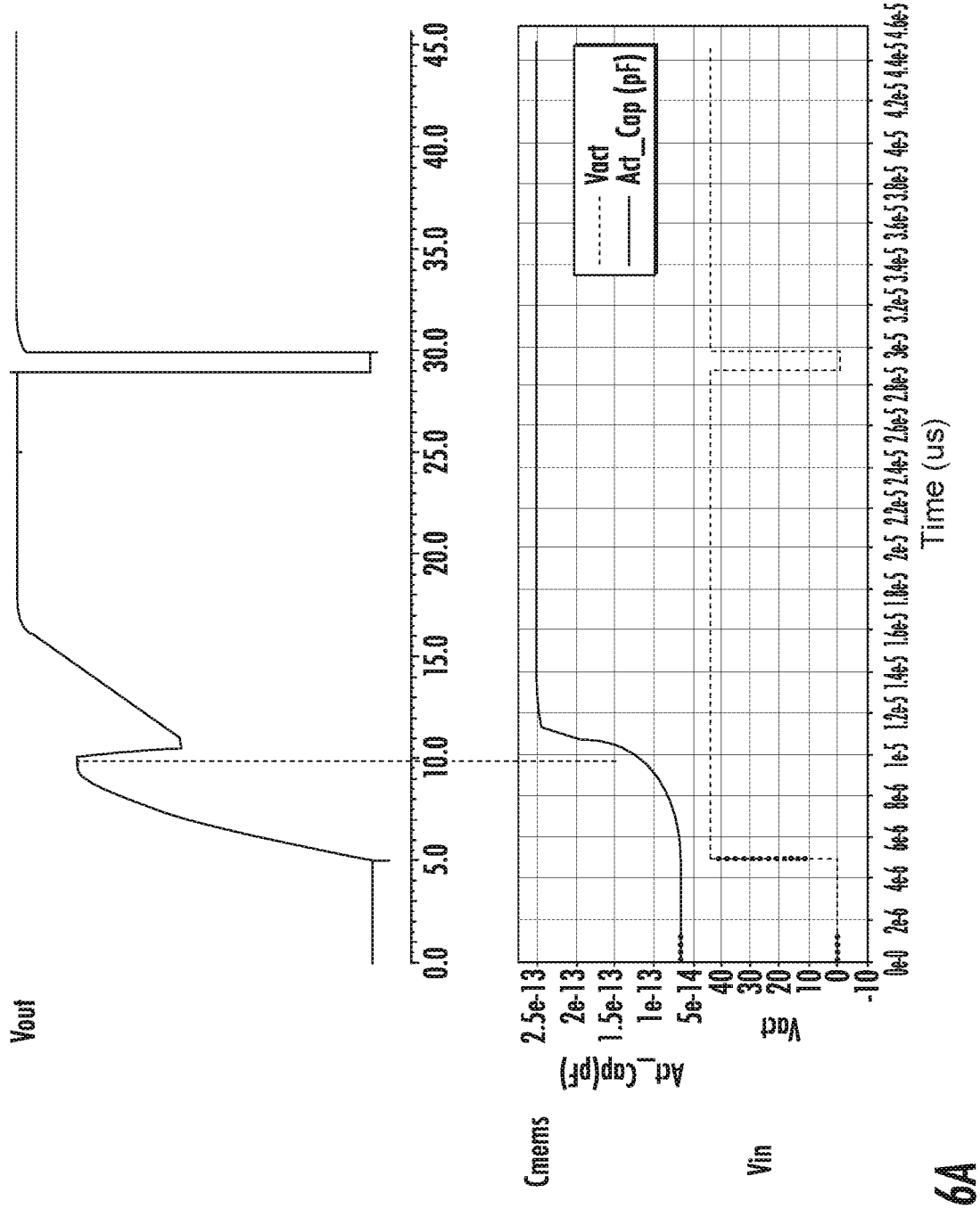
FIGS. 6A-6C includes several graphs illustrating a comparison between the output voltage of a driven device connected to a possible driver circuit, the capacitance of the driven device, and the input voltage applied to the driver circuit.

Turning briefly to FIG. 6A, where the middle plot illustrates the rate of change of the capacitance of the driven device 102, for example a MEMS actuator. In this particular scenario, the maximum rate of change of the capacitance, or the slope of the change in capacitance plot, stays below 600 µF/s, and the switching time is under 20 µs. Thus, in some embodiments, for example and without limitation, it is desired to design the driver circuit 100 such that the switching time is set to be below 20 µs and the peak rate of change of the capacitance of the driven device 102 is less than 600 µF/s.

Turning back to FIG. 1A, in some embodiments, when the voltage divider 122 comprises a combination of PFETS and NFETS, the number of PFETS or NFETS is dependent upon several factors including the type and structure of FETs used in the slew rate limiting pull-in circuit 104 and/or the slew rate limiting releasing circuit and the desired voltage needed for the tap 128. For example, as described above, if the devices in the slew-rate limiting pull-in circuit 104 are PFETS, then the corresponding devices that they connect to in the voltage divider 122 will also need to be PFETS. The scenario would be the same for the slew-rate limiting releasing circuit 106. Similarly, if the devices in the slew-rate limiting pull-in circuit 104 are NFETS, then the corresponding devices that they connect to in the voltage divider 122 will also need to be NFETS. However, this identical nature only goes for the first control circuit 122a and the second control circuit 122b and their corresponding devices in the slew-rate limiting pull-in circuit 104 and the slew-rate limiting releasing circuit 106. In some embodiments, the remaining transistors in the voltage divider 122 can be any of the devices discussed above and the number of each type of device can be altered or adjusted so long as the feedback voltage $V_{fb}$ being provided at the tap 128 reaches the desired divided voltage to compare to the reference feedback voltage 110 by the comparator 124. In some embodiments, the number of devices (i.e., PFETs, NFETs, diodes, capacitors, resistors, etc.) that the voltage divider 122 comprises can be adjusted or changed in order to achieve the desired voltage being provided at the tap 128. As discussed herein, if the slew-rate limiting releasing circuit 106 is not included in an embodiment of the driver circuit 100, then the voltage divider 122 can be comprised of all PFET devices.

In the present disclosure, the principle of operation remains substantially the same regardless of the various device types composing the feedback network. In some embodiments, the feedback network leverages the transconductance region of MOSFET structures through mirroring from the feedback network to the charging network 140. Furthermore, in any configuration, the feedback network is designed to have minimum current drain from the regulated power supply node 114. Where PFET diodes are used, these elements can exhibit a similar voltage-divider ratio as resistors (minus the effects of the device's wells).

In some embodiments, as described above, the driver circuit 100 can comprise one or more slew rate limiting pull-in circuits 104 and/or one or more slew rate limiting release circuits 106. Each of these circuits is configured to limit the rate at which charge is supplied to or drained/grounded from the driven element 102. For example, in some embodiments, depending on the possible connections used the slew rate limiting pull-in circuits 104 can be configured to control or set a rate at which the driven element is charged or discharged. Additionally, in some embodiments, depending on the possible connections used the slew rate limiting releasing circuits 106 can be configured to control or set a rate at which the driven element is charged or discharged, but it will be the opposite control as the slew rate limiting pull-in circuit 104 (i.e., if the slew rate limiting pull-in circuit 104 is configured to control or set the rate at which the driven device 102 is charged, then the slew rate limiting releasing circuit 106 is configured to control or set a rate at which the driven device 102 is discharged). As a result, by limiting the rate at which charge is supplied to or drained from the driven element 102, the present subject matter thus correspondingly limits the acceleration of an actuator within the driven element 102 (i.e., a MEMS actuator) and avoids or at least limits high velocity pull-in or release (i.e. when the MEMS actuator, or other driven element 102 transitions from a "CLOSED" state to an "OPENED" state, or vice-versa) and the associated mechanical instability of the device during charging. In this way, the presently disclosed systems, devices, and methods for controlling a voltage supply to an electronic device prevent the connected actuators from rapidly reaching the supply voltage.

In some embodiments, the driver circuit 100 comprises one or more LDMOS or CMOS PFETS to act as standard high voltage standoff FETS that can achieve a standoff of greater than 50 V of the regulated power supply node 114 being applied to the driven device 102. For example and without limitation, in some embodiments the driver circuit 100 can comprise a driving LDMOS or CMOS PFET 116a connected in series between the power supply node 114 and the driven device node 150 and a releasing LDMOS or CMOS NFET 116b connected between the driven device node 150 and the second circuit node 154. In embodiments where the one or more slew rate limiting releasing circuit 106 is included, the releasing LDMOS or CMOS NFET 116b is connected such that the one or more slew rate limiting releasing circuits 106 is connected between the releasing LDMOS or CMOS NFET 116b and the second circuit node 154. Separately, or in combination, these LDMOS or CMOS FETs 116a and 116b act as traditional level translator outputs. In other words, the LDMOS or CMOS FETs 116a and 116b are used to gate or pass the charge or discharge the electrodes of the driven device 102 based on which one is turned on by the level shifter 120.

In some embodiments, the driver circuit 100 includes only one or more slew rate limiting pull-in circuit 104, driving LDMOS or CMOS PFET 116a, and releasing LDMOS or CMOS NFET 116b, in which case slew rate limiting release circuit 106 is excluded. In some embodiments, the opposite is true. As discussed above, the driving LDMOS or CMOS PFET 116a is the driver of charge to the driven device 102. As another hypothetical, if, like in some embodiments, the slew rate limiting pull-in circuit 104 was not present, the power supply node 114 was ramped up to 40V, and the driving LDMOS or CMOS PFET 116a was turned on, then the current flowing through the driving LDMOS or CMOS PFET 116a would rush to the driven device 102 and quickly charge the electrode applying the 40V to the electrode of the driven device 102 almost immediately. The charging would occur substantially faster than if the slew rate limiting pull-in circuit 104 was present and operating. This causes a movable electrode of the driven device 102 to be attracted to the powered/charged electrode and snap or pull-in to the powered electrode at a very fast speed potentially damaging the structural integrity of the electrodes. By including the slew-rate limiting pull-in circuit 104 in series with the driving LDMOS or CMOS PFET 116a and controlling the current going through the connection via a current mirror, then the rate at which the charge is applied to the driven device 102 via the driving LDMOS or CMOS PFET 116a is reduced substantially causing the electrode of the driven device 102 to snap or be pulled in much more slowly.

In some embodiments, the driver circuit 100 includes the slew rate limiting pull-in circuit 104 and corresponding driving LDMOS or CMOS PFET 116a for pull-in voltage slew rate regulation as well as a slew rate limiting release circuit 106 and corresponding releasing LDMOS or CMOS NFET 116b for regulating or slowing the rate at which the previously charged electrode is discharged and the driven device 102 transitions from a "CLOSED" state to an "OPEN" state. Similarly to the function of the driving LDMOS or CMOS PFET 116a, the releasing LDMOS or CMOS NFET 116b is configured such that, when it is turned on, it discharges the driven device 102 and the moveable electrode within the driven device 102 jolts away from the previously powered electrode in an opening fashion. In some embodiments where the slew-rate limiting releasing circuit 106 is not present, then the opening action of the driven device 102 occurs very fast and, much like the closing action can damage the driven device 102. However, with the slew-rate limiting releasing circuit 106 in place, the rate at which the powered electrode is discharged (i.e., the rate at which the current flows from the powered electrode to ground or some other reference node, thereby discharging the previously powered electrode) is reduced and allows the moveable electrode to release much more slowly.

In some embodiments, where both the driving LDMOS or CMOS PFET 116a and the releasing LDMOS or CMOS NFET 116b are included in the driver circuit 100, only one is configured to be turned on or active at a time. However, in some further embodiments, where both the driving LDMOS or CMOS PFET 116a and the releasing LDMOS or CMOS NFET 116b are included in the driver circuit 100, both FETS are configured such that they can be turned on or active at a time, for example, during a transition period. By turned-on, it should be noted, that those of ordinary skill in the art will appreciate that this means that the transistors are activated such that current passes through them (i.e., the voltage across the appropriate terminals is at the turn-on voltage of the transistors).

In some embodiments, circuitry for shifting between charging and discharging of the driven device 102 is needed. As illustrated in FIG. 1A through FIG. 3, one way of performing the shift between charging and discharging the driven device 102 can include using a level-shifter 120 with a control input voltage 118. Those of ordinary skill in the art will appreciate that various implementations of the level-shifter 120 are envisioned, one possible way is depicted and described in FIGS. 2 and 3. In essence, the level-shifter 120 is configured to switch between which of the driving LDMOS or CMOS PFET 116a or the releasing LDMOS or CMOS NFET 116b is turned on or activated at a time according to the control input voltage 118 applied to the level-shifter 120. In some embodiments, the level shifter 120 is a standard cross-coupled LDMOS (HVCMOS) structure that does not have standby current in steady state condition. One or more of the gates of the transistors of the level shifter 120 are thin oxide meaning they can only handle low voltage $V_{GS}$. Therefore, there are intermediate devices in between (transistors, diodes, and/or other devices) with sources tied to rail supplies. These intermediate devices use a regulated voltage to keep the high side PFETs in a low $V_{GS}$ condition.

In some embodiments, it can be said that all or some of the level shifter 120, input control voltage 118, slew rate limiting pull-in circuit 104, driving LDMOS or CMOS PFET 116a, releasing LDMOS or CMOS NFET 116b, and/or the slew rate limiting releasing circuit 106 (if it is included) can all be described as a driver stage 142. In some embodiments, the driver stage 142 can be incorporated all within a single device, or the devices and elements within the driver stage 142 can all be discrete and separate elements, depending on the particular design and implementation choices of the users/designer.

In some embodiments, as described herein, the slew rate limiting pull-in circuit 104 can be configured to control or set the rate at which the driven device 102 is charged and the slew rate limiting releasing circuit 106 can be configured to control or set the rate at which the driven device 102 is discharged. As a first hypothetical, assume that the power supply node 114 was set at high voltage (i.e., 40V) and the second circuit node 154 was set at low voltage (i.e. 0V). In this case, the slew rate limiting pull-in circuit 104 would operate to control or set the rate at which the driven device 102 is charged and the slew rate limiting releasing circuit 106 would operate to control or set the rate at which the driven device 102 is discharged. As a second hypothetical, assume that the power supply node 114 was set at high voltage (i.e., 22V) and the second circuit node 154 was set at low voltage (i.e. −22V) and the driven device 102 had a reference at −22V. In this case, the slew rate limiting pull-in circuit 104 would operate to control or set the rate at which the driven device 102 is charged and the slew rate limiting releasing circuit 106 would operate to control or set the rate at which the driven device 102 is discharged. However, in some embodiments, the slew rate limiting pull-in circuit 104 can be configured to control or set the rate at which the driven device 102 is discharged and the slew rate limiting releasing circuit 106 can be configured to control or set the rate at which the driven device 102 is charged. As a third hypothetical, assume that the power supply node 114 was set at a low voltage (i.e., 0V) and the second circuit node 154 was set at a high negative voltage (i.e. −40V). In this case, the slew rate limiting pull-in circuit 104 would operate to control or set the rate at which the driven device 102 is discharged and the slew rate limiting releasing circuit 106 would operate to control or set the rate at which the driven device 102 is charged. Both of the first and third hypotheticals assume that the potential of the other side of the driven device 102 is 0V.

Keeping the above hypotheticals in mind, the description herein assumes that the power supply node 114 is the high voltage node and that the second circuit node 154 is the low voltage node. However, as discussed above, the below principles and operations can be reversed, based on the voltage applied to each node as discussed above.

Referring now to the embodiment illustrated in FIG. 1B, in some embodiments, one or more of the FET diodes in the first control circuit 122a can be connected to corresponding FETS of the slew rate limiting pull-in circuit 104 and one or more of the FET diodes in the second control circuit 122b can be connected to corresponding FETS of the slew rate limiting releasing circuit 106, as a current mirroring device. In the embodiment illustrated in FIG. 1B, the voltage divider 122 comprises a first PFET diode 122a-1 (i.e., making up the first control circuit 122a) and a first NFET diode 122b-2 (i.e., making up the second control circuit 122b). However, this should not be construed so as to limit the voltage divider 122 or the first control circuit 122a or the second control circuit 122b to this particular implementation. Additionally, between the first PFET diode 122a-1 and the first NFET diode 122b-2, one or more diodes can be connected. As described above, this should not be limiting in any way, as the diodes depicted in FIG. 1B could also be PFETs, NFETs, capacitors, and/or resistors. Moreover, in this embodiment, the slew rate limiting pull-in circuit 104 can comprise a pull-in mirror FET 104a, which is a specific instantiation of the slew rate limiting pull-in circuit 104 to induce action, connected in parallel with respect to the voltage divider 122 between the power supply node 114 and the driven device node 150. In some embodiments, the pull-in mirror FET 104a is substantially identical in structure, properties, and design to the PFET diode 122a-1 and a gate of the pull-in mirror FET 104a is connected to a corresponding gate of the PFET diode 122a-1 via connection 130a-1. Furthermore, the pull-in mirror FET 104a has a gate width and a gate length that is selected relative to a gate width and gate length, respectively, of the PFET diode 122a-1. In some embodiments, the releasing mirror FET 106b, which is a specific instantiation of the slew rate limiting releasing circuit 106 to induce actuation, is substantially identical in structure, properties, and design to the NFET diode 122b-2 and a gate of the releasing mirror FET 106b is connected to a corresponding gate of the NFET diode 122b-2 via connection 130b-2. Furthermore, the releasing mirror FET 106b has a gate width and a gate length that is selected relative to a gate width and gate length, respectively, of the NFET diode 122b-2.

If the gate-drain of the top PFET diode 122a-1 is connected to pull-in mirror FET 104a having the same source-body connection and the same gate width and length, then the two devices are said to have a mirror ratio or current mirror ratio of 1 and will have very little mismatch in their output drain current. If the drain of the pull-in mirror FET 104a is then placed in series with the driving LDMOS or CMOS PFET 116a of the driver circuit 100, then the driven device 102 will be charged at the mirror-ratioed rate as the charge from of the power supply node 114 occurs. Thus, in some embodiments of the present disclosure, the pull-in mirror FET 104a and the top PFET diode 122a-1 are provided and configured such that a precise current mirroring occurs between them. Thus, the current running through the pull-in mirror FET 104a is substantially identical to the current running through the top PFET diode 122a-1. Additionally, in some embodiments, the systems and devices of the present disclosure operate with a current mirror ratio other than 1. This causes the current that is running through the pull-in mirror FET 104a to be lower (i.e., mirror ratio less than 1) or higher (i.e., mirror ratio greater than 1) than the current running through the top PFET diode 122a-1. A similar current mirroring occurs in the slew rate limiting releasing circuit 106b and the bottom NFET diode 122b-2.

Figure 1C:
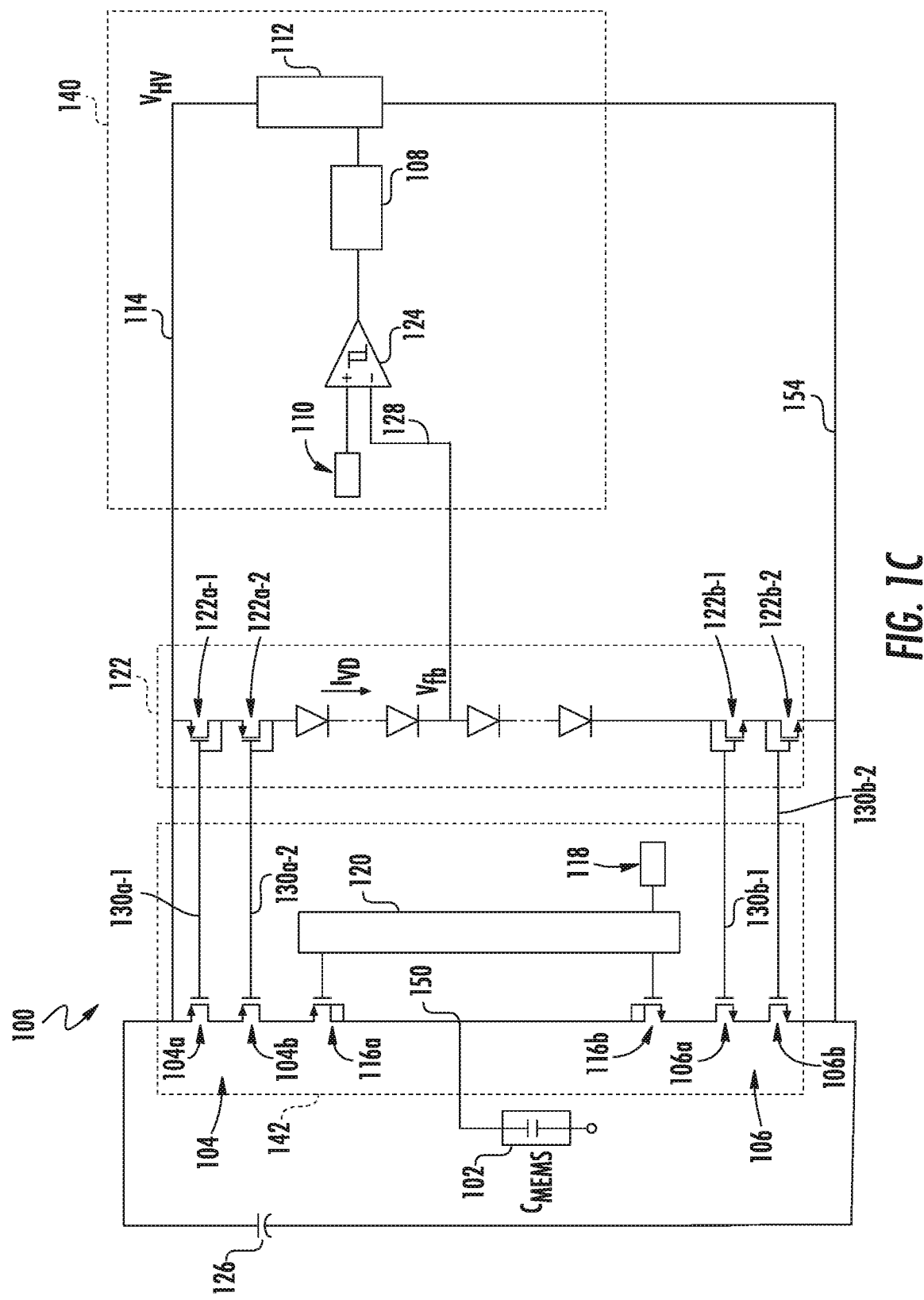

Referring to FIG. 1C, in some embodiments, the pull-in mirror FET 104a can be included as discussed above and can be connected in series with a second pull-in mirror FET 104b, also a specific instantiation of the slew rate limiting pull-in circuit 104. In such an embodiment, the second pull-in mirror FET 104b can be connected to the second highest PFET diode 122a-2 via connection 130a-2 in order to provide the second pull-in mirror FET 104b with the appropriately mirrored current. Additionally, in embodiments where it is present, the second pull-in mirror FET 104b is configured to ensure that the voltage drop across the first pull-in mirror FET 104a is substantially identical to the voltage drop across the top PFET diode 122a-1. In both of these embodiments, only the slew rate limiting pull-in circuit 104 is present. In some embodiments, one, both, or two or more mirror FETs can be connected in parallel to make up the slew rate limiting pull-in circuit 104. In such an embodiment, each parallel-connected mirror FET will be connected to a corresponding PFET diode 122a-n in the voltage divider 122 string, as shown in FIG. 1C.

In some embodiments, a similar structure can be provided on the low side (NFET) of the voltage supply to enable a controlled turn-off or discharge of the connected electronic device (i.e., the driven device 102). For example and without limitation, in some embodiments, both the slew rate limiting pull-in circuit 104 is present, including one or more pull-in mirror FETS 104a and 104b connected in series with each other and connected via connections 130a-1 and 130a-2, respectively, to a corresponding PFET diode 122a-1 and 122a-2, respectively, and the slew rate limiting releasing circuit 106 is also present. Like the slew rate limiting pull-in circuit 104, in some embodiments, the slew rate limiting releasing circuit 106 can comprise one or more releasing mirror FETS 106a and 106b, also a specific instantiation of the slew rate limiting releasing circuit 106, connected in series with one another between the second circuit node 154 and the driven device node 150. In such an embodiment, each releasing mirror FET 106a, 106b, etc. can have a separate and/or discrete connection 130b-1 and 130b-2 to the second control circuit 122b of NFET diodes in the voltage divider 122. As shown in FIG. 1C, in some embodiments, two releasing mirror FETs 106a and 106b are present and connected via 130b-1 and 130b-2, respectively, to FET diodes 122b-1 and 122b-2 respectively.

In such an embodiment, each of the one or more releasing mirror FETs 106a and 106b can have a gate width and a gate length that are both selected relative to a gate width and gate length, respectively, of a corresponding one of the plurality of NFETs of the voltage divider 122 (i.e. PFET diodes 122b-1 and 122b-2, respectively). For example, and without limitation, if the gate-drain of the bottom NFET diode 122b-2 is connected to a releasing mirror FET 106b having the same source-body connection and the same gate width and length, then the two devices are said to have a mirror ratio of 1 and will have very little mismatch in their output drain current with identical drain voltage. If the drain of the releasing mirror FET 106b is then placed in series with the CMOS NFET 116b of the MEMS driver circuit, then the driven device 102 will be discharged at the mirror-ratioed rate as the discharge of the power supply node 114 occurs. Additionally, the bottom NFET diode 122b-2 can drive releasing mirror FET 106b. The releasing mirror FET 106b, which is mirroring the feedback 'tail' current, can be placed in series with the releasing mirror FET 106a and the LDMOS or CMOS NFET driver 116b. Such a structure is not required to control the MEMS charge slew rate, but it can help to more predictably and consistently control the slew rate, especially in discharging when the MEMS or driven device 102 is transitioning from a CLOSED state to an OPEN state. Additionally, in embodiments where it is present, the releasing mirror FET 106a is configured to ensure that the voltage drop across the releasing mirror FET 106b is substantially identical to the voltage drop across the top PFET diode 122b-2. When mixing PFETS and NFETS (and resistors, etc.) in the feedback network, care must be taken to achieve the proper feedback ratio or Beta to achieve the proper feedback voltage $V_{fb}$. In some embodiments, if the releasing mirror FETS 106a and 106b are omitted, as discussed in some embodiments above, then bottom diodes 122b-1 and 122b-2 can be selected to be PFETS.

In some embodiments, it can be advantageous for the power supply node 114 to have a storage capacitor 126 substantially larger than the capacitance of the MEMS device or other driven device 102 in case the power supply 112 was off during transition of the driven device 102 (e.g., a MEMS device or actuator) from "OPENED" to "CLOSED", or from "CLOSED" to "OPEN". As depicted in FIG. 1B, the storage capacitor 126, in some embodiments, can be connected between the power supply node 114 and the second circuit node 154 or GND.

In some embodiments, the comparator 124 can be designed such that the oscillator 108 is controlled to be on during transition. In either configuration, the rate of change of voltage (dV/dt) to the driven element 102 can be controlled to be substantially equal to $I_{VD}/C_{MEMS}$ or a function of $I_{VD}/C_{MEMS}$, i.e., $f(I_{VD}/C_{MEMS})$, since the change in MEMS capacitance is non-linear, where the voltage divider current $I_{VD}$ is equal to the current flowing through the voltage divider 122, as indicated on the FIGS. 1A-1G, and $C_{MEMS}$ is the capacitance of the driven element 102, which can be a MEMS device or other capacitor like driven element 102. In embodiments where the driven device 102 is a MEMS device, the capacitance of the MEMS device will be dynamic. Therefore it will not have a straight I/C equation and the Close/Release time could be affected by this varying capacitance as it traverses from ON (i.e., substantially charged) to OFF (i.e., substantially not charged) or OFF to ON. Thus, in some situations, like those where the capacitance of the driven device 102 is dynamic, it is necessary to adjust the change of voltage equation to account for this dynamic capacitance, hence why the change of voltage (dV/dt) of the driven element 102 can be controlled to be substantially equal to a function of $I_{VD}/C_{MEMS}$, where the function is used to account for this dynamic capacitance.

In this regard, in embodiments wherein the driven element 102 is a MEMS device, as the MEMS electrodes move closer together and the MEMS capacitance increases while the charge on the MEMS capacitance increases linearly with time based on the current limiter, the change in voltage of the driven element 102 is thereby further constrained. In some embodiments, the system may use a mirror ratio other than 1. As a hypothetical example, the mirror ratio is approximately 2. In this hypothetical the FET gate width for both the pull-in mirror FET 104a and the corresponding FET 122a-1 in the first control circuit 122a that connects to the pull-in mirror FET 104a is 1 μm, the FET gate length for corresponding FET 122a-1 in the first control circuit 122a is 20 μm, and the gate length for the pull-in mirror FET 104a is 10.5 μm. To get the mirror ratio, the FET gate length for the corresponding FET 122a-1, 20 μm in this case, is divided by the gate length for the pull-in mirror FET 104a, 10.5 μm. 20 μm divided by 10.5 μm is approximately 2. In this hypothetical, assume also that the voltage divider current $I_{VD}$ is 100 nA. Because the mirror ratio in the pull-in mirror FET 104a is 2, the current running through the pull-in mirror FET 104a would be equal to 2 times the voltage divider current $I_{VD}$ (i.e., 200 nA).

In this configuration, by adjusting the mirror ratio between the elements of the voltage divider 122 and the pull-in mirror FETs 104a and 104b of the slew rate limiting pull-in circuit 104 and the releasing mirror FETs 106a and 106b of the slew rate limiting release circuit 106, the rate at which the driven element 102 is charged or discharged can be controlled or set. As a result, by modulating this charging rate, the rate at which the driven element 102 is driven between an "OPEN" state and a "CLOSED" state can be correspondingly controlled or set by the slew rate limiting pull-in mirror FETs 104 and the rate at which the driven element 102 is driven between a "CLOSED" state and an "OPEN" state can be controlled or set by the slew rate limiting release mirror FETs 106.

In some embodiments, the top two (or more) PFETS 122a-1 and 122a-2 in the voltage divider 122 would keep the VDS of the top diode PFET 122a-1 substantially equal to the VDS of the top pull-in mirror FET 104a allowing the mirrored current to be more constant over transition voltage changes.

Figure 1D:
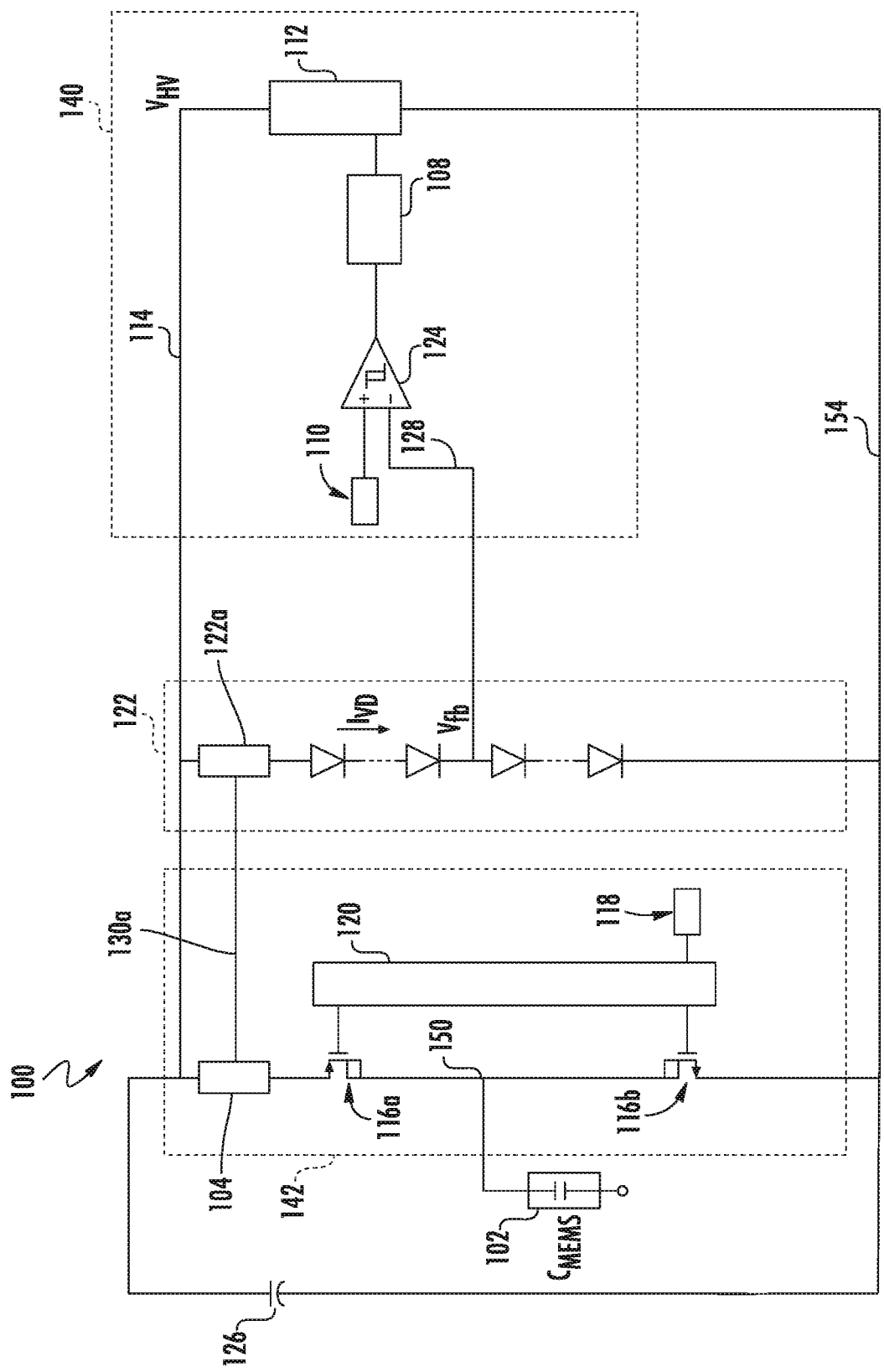

As discussed herein, in some embodiments of the driver circuit 100, only slew rate limiting for the transition from an "OPENED" state to a "CLOSED" state is desired. In such an embodiment, as illustrated in FIG. 1D, only the slew rate limiting pull-in circuit 104 is included and the slew rate limiting releasing circuit 106 is excluded. In this particular embodiment, the slew rate limiting pull-in circuit 104 can include just pull-in mirror FET 104a or it can include both pull-in mirror FET 104a and pull-in mirror FET 104b. The functionality of a circuit that includes only the slew rate limiting pull-in circuit 104 includes only limiting the rate at which the driven device 102 "closes," as described herein. It does not control the slew rate of the "opening" of the driven device 102. This figures also highlights the fact that in some embodiments, there need be only one control circuit. Here, only the first control circuit 122a is present and the second control circuit 122b is not necessary. Also, as highlighted by FIG. 1D, the voltage divider can comprise one or more diodes, FETS, PFET, NFETS, resistors, etc. and the number is determined by the feedback voltage $V_{fb}$ that needs to be tapped 128 to the comparator 124. Although four diodes are shown connected in FIG. 1D, this should not be construed as being limiting.

Figure 1E:
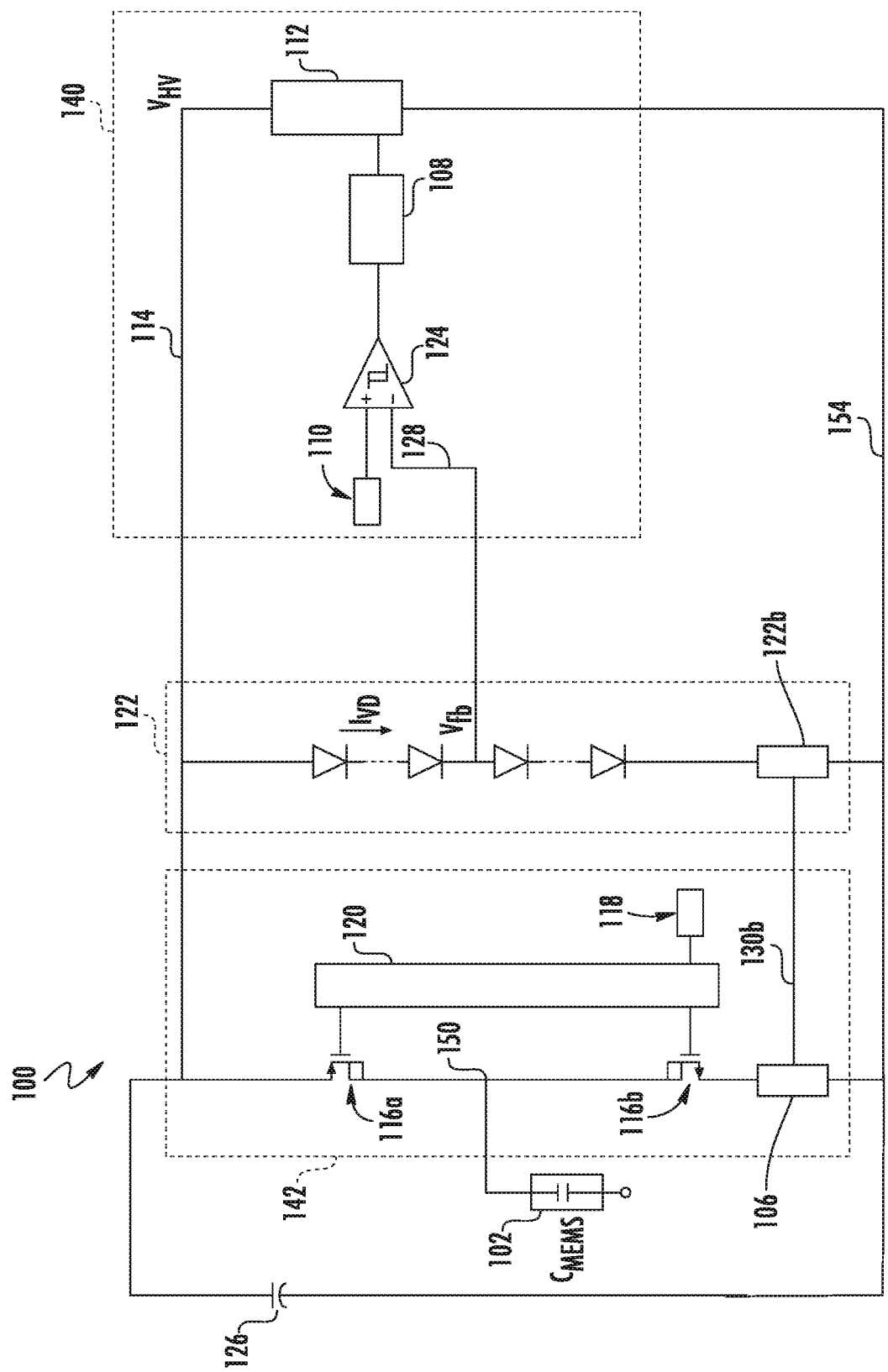

Furthermore, as discussed herein, in some embodiments of the driver circuit 100, only slew rate limiting for the transition from a "CLOSED" state to an "OPENED" state is desired. In such an embodiment, as illustrated in FIG. 1E, only the slew rate limiting releasing circuit 106 is included and the slew rate limiting pull-in circuit 104 is excluded. In this particular embodiment, the slew rate limiting releasing circuit 106 can include just releasing mirror FET 106b or it can include both releasing mirror FET 106a and releasing mirror FET 106b. The functionality of a circuit that includes only the slew rate limiting releasing circuit 106 includes only limiting the rate at which the driven device 102 "opens", or releases, as described herein. It does not control the slew rate of the "closing" of the driven device 102.

Figure 1F:
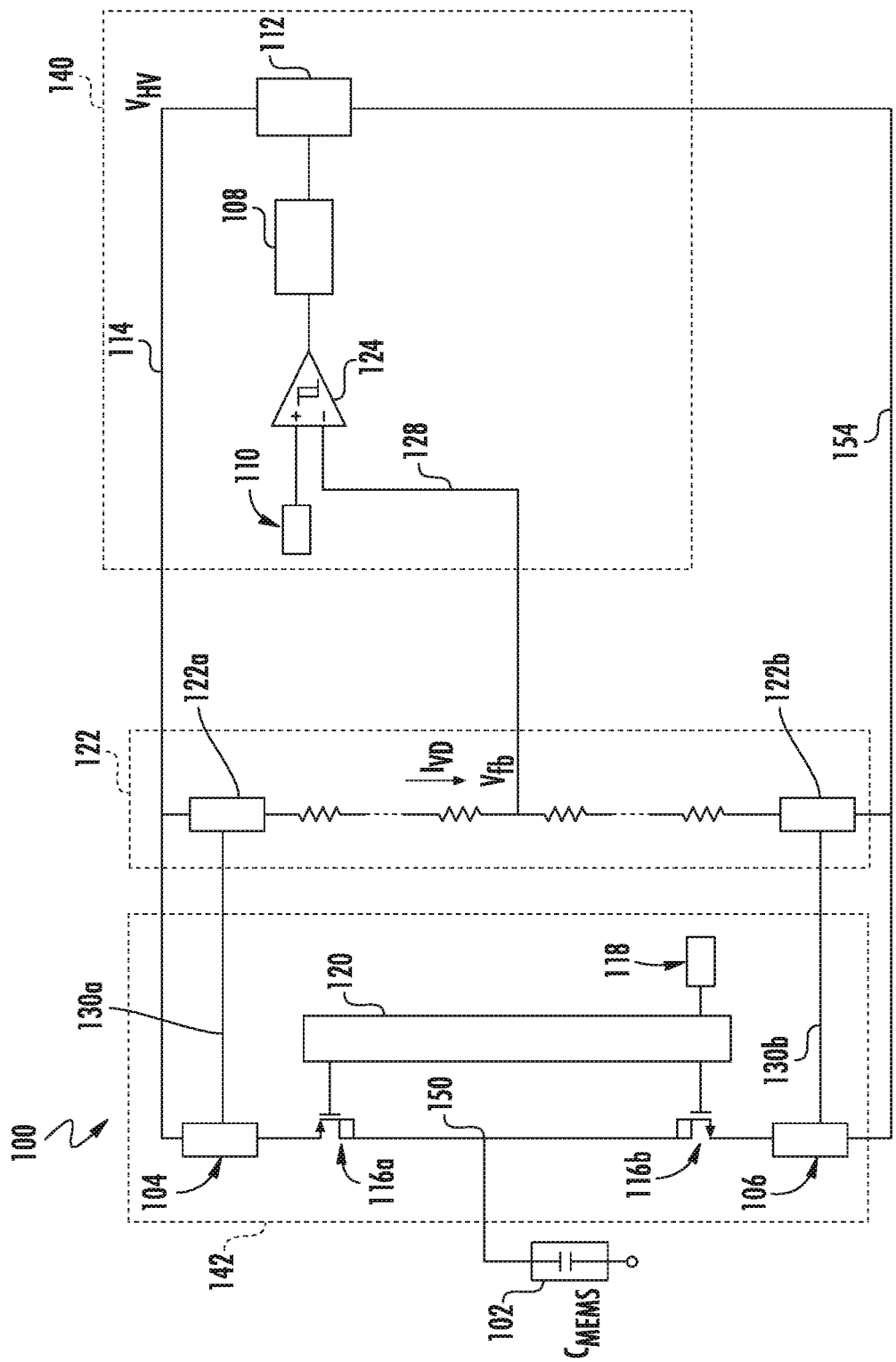

Moreover, as described herein, in some embodiments, the voltage divider 122 circuit includes one or more PFETS, NFETS, and/or resistors. For example and without limitation, FIG. 1F illustrates the same driver circuit 100 as FIG. 1A, however, in this particular embodiment, the voltage divider 122 comprises one or more PFETs/NFETs at the top (i.e. the first control circuit 122a) for connecting to the pull-in mirror FETs 104a, 104b, and/or one or more PFETs/NFETs at the bottom (i.e., the second control circuit 122b) for connecting to the releasing mirror FETs 106a, and 106b, but the remaining devices in the voltage divider 122 comprise one or more resistors (i.e., of varying or all the same resistances). In some embodiments, the resistors can be for example and without limitation, poly-silicon resistors, where the ratio of the integrated resistors is selected to output a predetermined feedback voltage $V_{fb}$ (e.g., between about 0.5V and 5V) out of the tap 128 when $V_{HV}$ (i.e., the voltage of the power supply node 114) equals the desired power supply value or voltage. In the case of a resistor-based feedback network, the devices in the first control circuit 122*a* and/or second control circuit 122*b* of the voltage divider 122 string can still be comprised of FET diodes that would be used to mirror the voltage divider current Ivo to the output drive (i.e. slew rate limiting pull-in circuit 104, LDMOS 116*a*, LDMOS 116*b*, and/or slew rate limiting release circuit 106) which sources the driven element 102 with current.

Figure 1G:
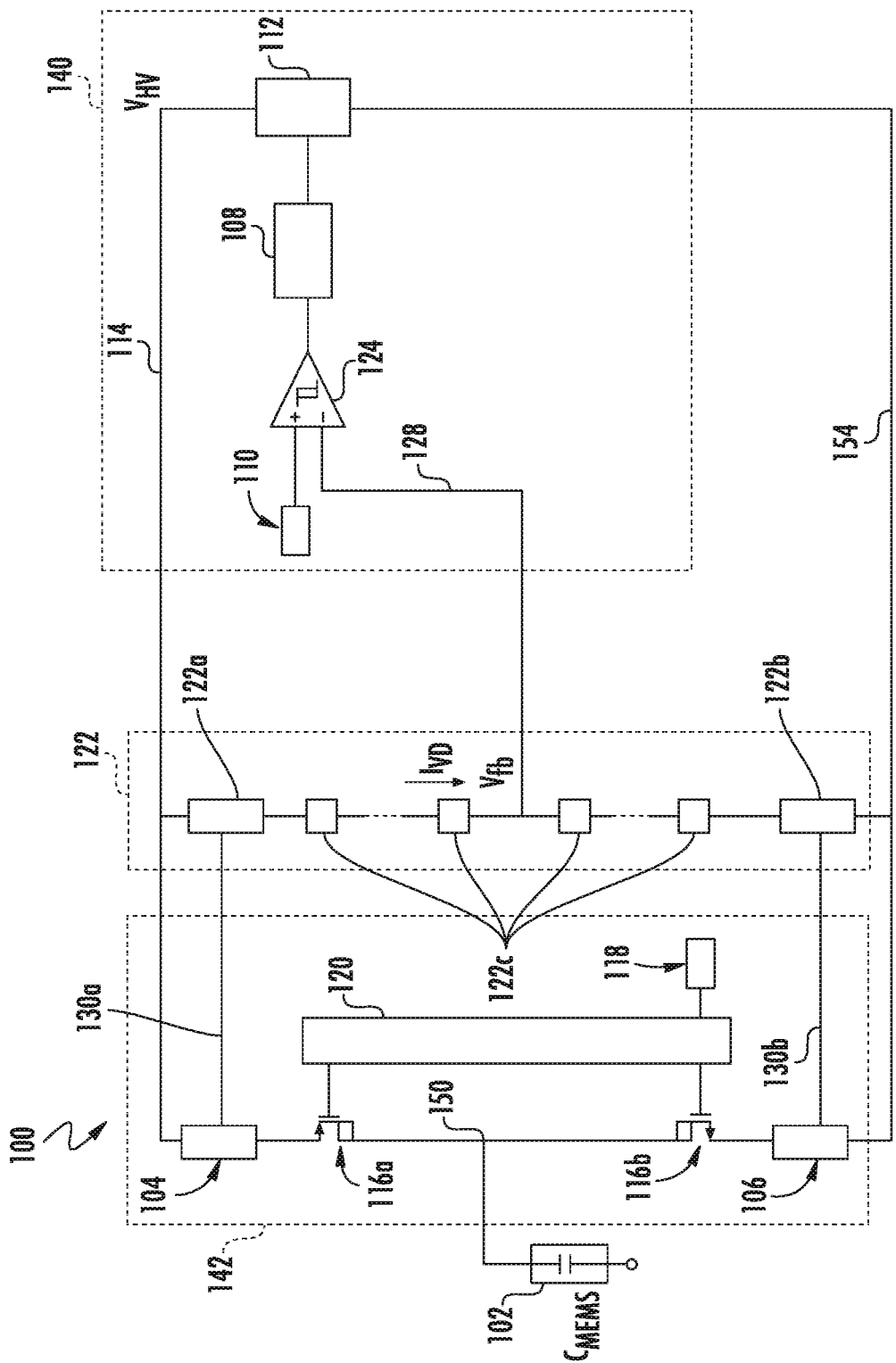

Turning next to FIG. 1G, which is substantially the same as FIG. 1F. However, in this embodiment, the resistors are replaced with boxes 122*c*. These boxes represent the notion that the voltage divider 122 can be comprised any number of suitable devices, such as diodes, resistors, transistors, FETs, or capacitors. The boxes 122*c* can include any number or all of the devices listed above.

In either embodiment, the goal remains the same: the voltage divider 122 is designed to give a reference current (i.e. voltage divider current Ivo) to either or both of the slew rate limiting pull-in circuit 104 or the slew rate limiting releasing circuit 106 and give a feedback voltage $V_{fb}$ to the comparator 124, which gates the oscillator 108 to help control the power supply 112.

Figure 2:
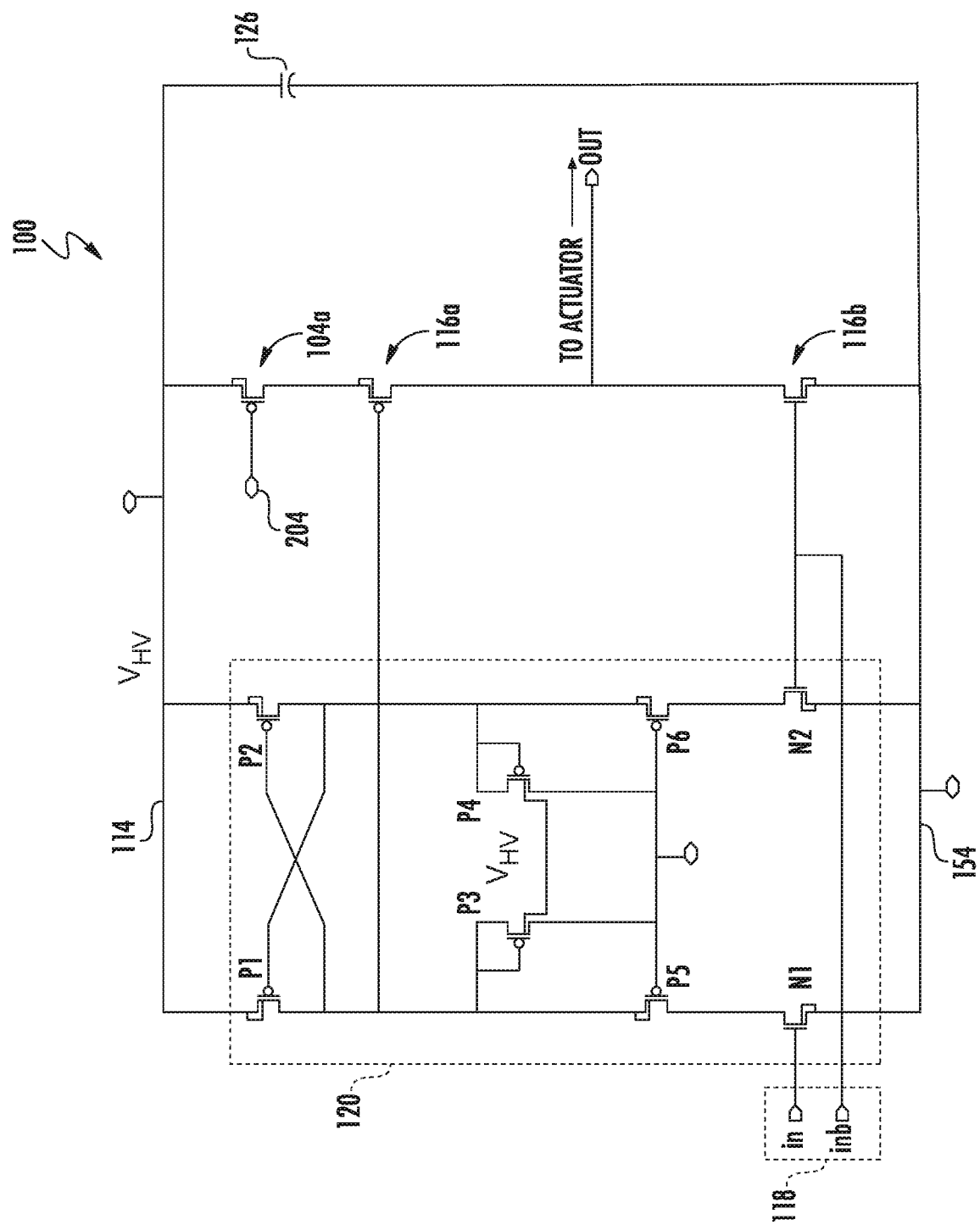

FIG. 2 provides an illustration of a further embodiment of a driver circuit 100, according to the present subject matter. As discussed above, a pull-in mirror FET 104*a* can form a current mirror with a voltage mirror source 204, with a gate of pull-in mirror FET 104*a* being connected to the voltage mirror source 204. For example, as discussed above, such a voltage mirror source 204 can be a fixed feedback voltage divider, such as a series of FETs connected as a voltage divider 122 between the power supply node 114 and the second circuit node 154 from FIG. 1A through FIG. 1G. When the output is switched high, current charging the actuator (i.e. driven device 102 or MEMS device) through driving LDMOS or CMOS PFET 116*a* of the driver circuit 100 is limited by pull-in mirror FET 104*a* in series. In this arrangement, the actuator charging current is effectively controlled by the area of pull-in mirror FET 104*a*. The actuator charging current flows to the driven element 102 via output 208.

FIG. 2 also depicts a more detailed drawing of one possible implementation of the level shifter 120 that could be used with the devices and systems of the present description. Specifically, the level-shifter 120 is configured to generate the control signals that determine when the driving LDMOS or CMOS PFET 116*a* or releasing LDMOS or CMOS NFET 116*b* is turned on and/or off at any given time. When the driving LDMOS or CMOS PFET 116*a* is turned on and the LDMOS or CMOS NFET 116*b* is turned off, then the driven device 102 is charged. When the driving LDMOS or CMOS PFET 116*a* is turned off and the LDMOS or CMOS NFET 116*b* is turned on, then the driven device 102 is discharged or grounded. In some embodiments, the level-shifter 120 can comprise a cross-coupled pair of transistors P1 and P2 which are driven by input transistors N1 and N2, which have inputs from the control input voltage 118. In some embodiments the transistors P3, P4, P5, and P6 can be included to help regulate the voltage and current delivered to the cross-coupled part of transistors P1 and P2. Various other designs and implementations of the level-shifter 120 are possible and thus, those of ordinary skill in the art will appreciate that the level shifter 120 depicted in FIGS. 2 and 3 should not be construed as limiting the driver circuit 100 to any particular implementation of a level shifter 120 that could be used for the present disclosure.

Figure 3:
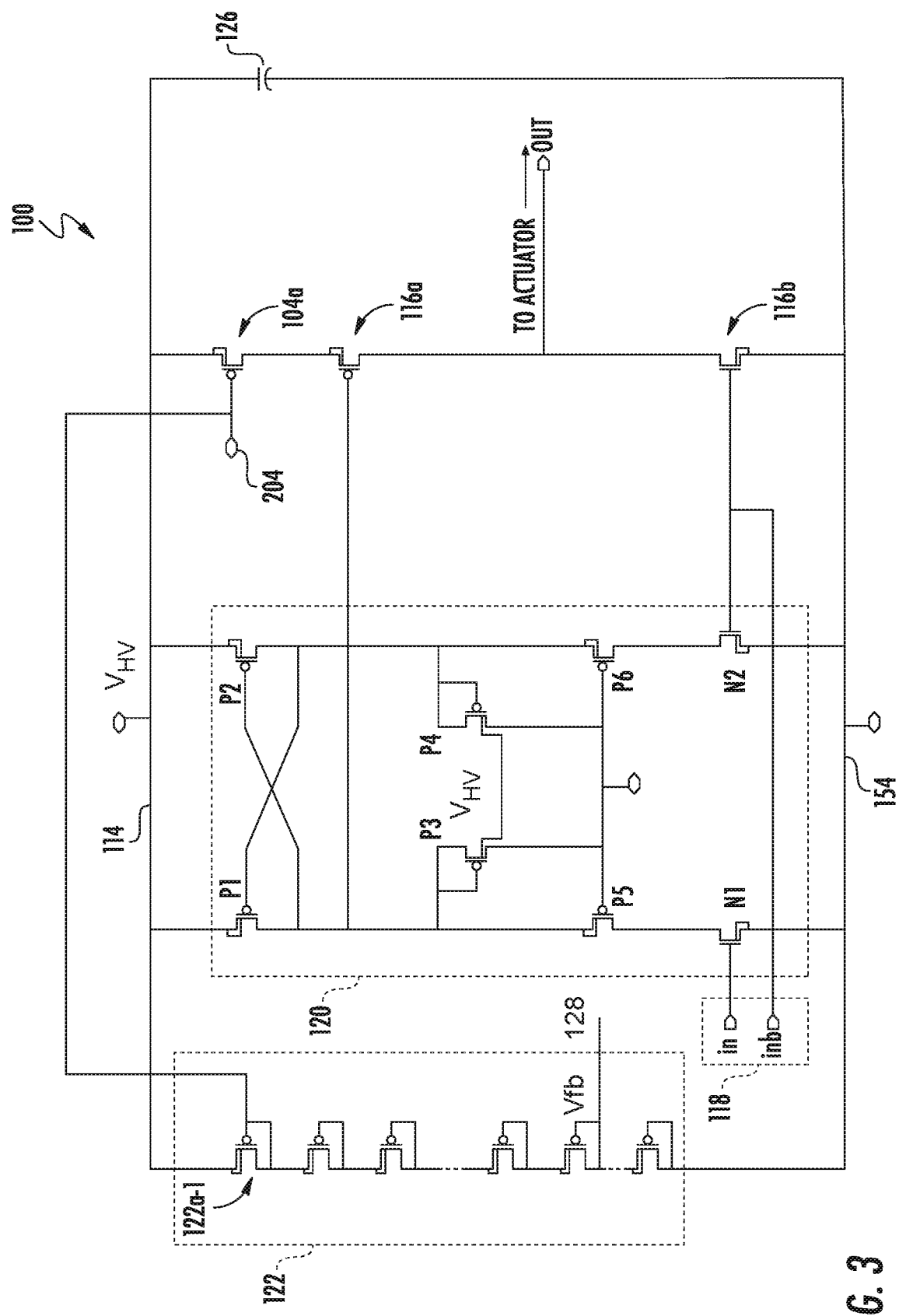

FIG. 3 illustrates the driver circuit 100 of FIG. 2, but with a fixed voltage divider 122 connected to the gate of the pull-in mirror FET 104*a*. In this embodiment, the voltage divider 122 circuit includes a series of PFET stages, at least the top stage having a channel width of about 1 μm, a channel length of about 20 μm, and a drain current of about 370 nA. Additionally, pull-in mirror FET 104*a* can be designed to have a channel width of about 1 μm and a channel length of about 10.5 μm to result in a mirror ratio of 20/10.5, or about 2, which results in a current throughput of approximately 705 nA (i.e., the drain current of the top PFET in the voltage divider 122, 370 nA, multiplied by the mirror ratio, 20/10.5). Thus, those having ordinary skill in the art will appreciate that the design of pull-in mirror FET 104*a* can be controlled to adjust the slew rate to the actuator.

Although this figure does not depict a second pull-in mirror FET 104*b* connected to a corresponding second PFET 122*a*-2, as discussed above, in some embodiments, a second pull-in mirror FET 104*b* connected to a corresponding second PFET 122*a*-2 can be included as shown in FIG. 1C, and these two devices can have identical structure or design or properties, and in some embodiments, they may have different structure or design or properties. The same is true for possible slew rate limiting releasing FETs 106*a*, 106*b*, and/or their corresponding connected bottom PFETs 122*b*-1 and 122*b*-2.

Figure 5A:
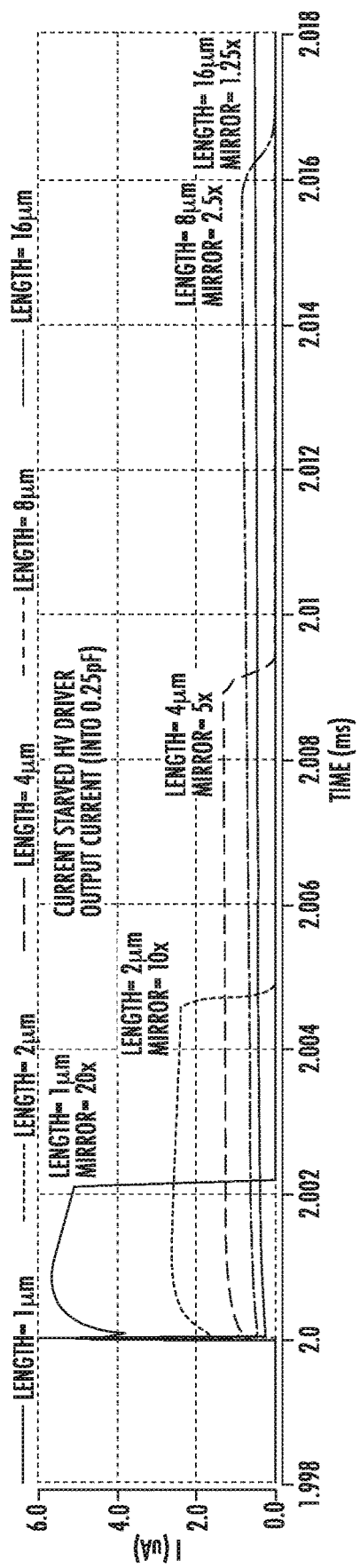
FIGS. 5A and 5B are graphs illustrating current over time for a voltage supply circuit for an electronic device according to various embodiments of the presently disclosed subject matter.
Figure 5B:
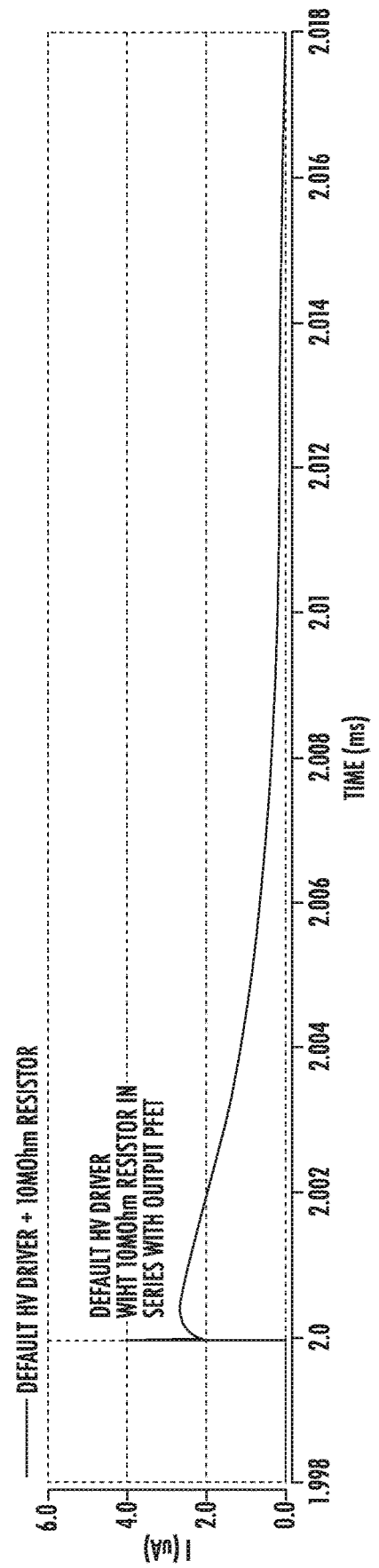

As illustrated in FIG. 4A, high-voltage driver output voltage, the size of pull-in mirror FET 104*a* can be adjusted in some embodiments to change the mirror ratio and thus the slew rate. In each case, the output voltage is loaded by a 0.25 pF actuator capacitance that is charged with approximately constant current and gives a linear voltage ramp. Additionally, as illustrated in FIG. 4A, increasing the mirror ratio allows more charging current and faster rise time. As discussed above, since the rate of charging corresponds to the rate at which a connected MEMS actuator is moved between states, the mirror ratio can be selected to control the motion of the MEMS actuator, which can be used to avoid pull-in, reduce impact forces, or otherwise regulate the transition from an "OPEN" state to a "CLOSED" state. For comparison, FIG. 4B further shows the comparable rates of a conventional high-voltage driver with 0 Ohm and 10 MOhm output resistors. In addition, referring to FIG. 5A, graphs of actuator charging current vs. the size of pull-in mirror FET 104*a* are shown. For comparison, FIG. 5B further shows the corresponding output of a conventional high-voltage driver with a 10 MOhm output resistor.

Figure 6B:
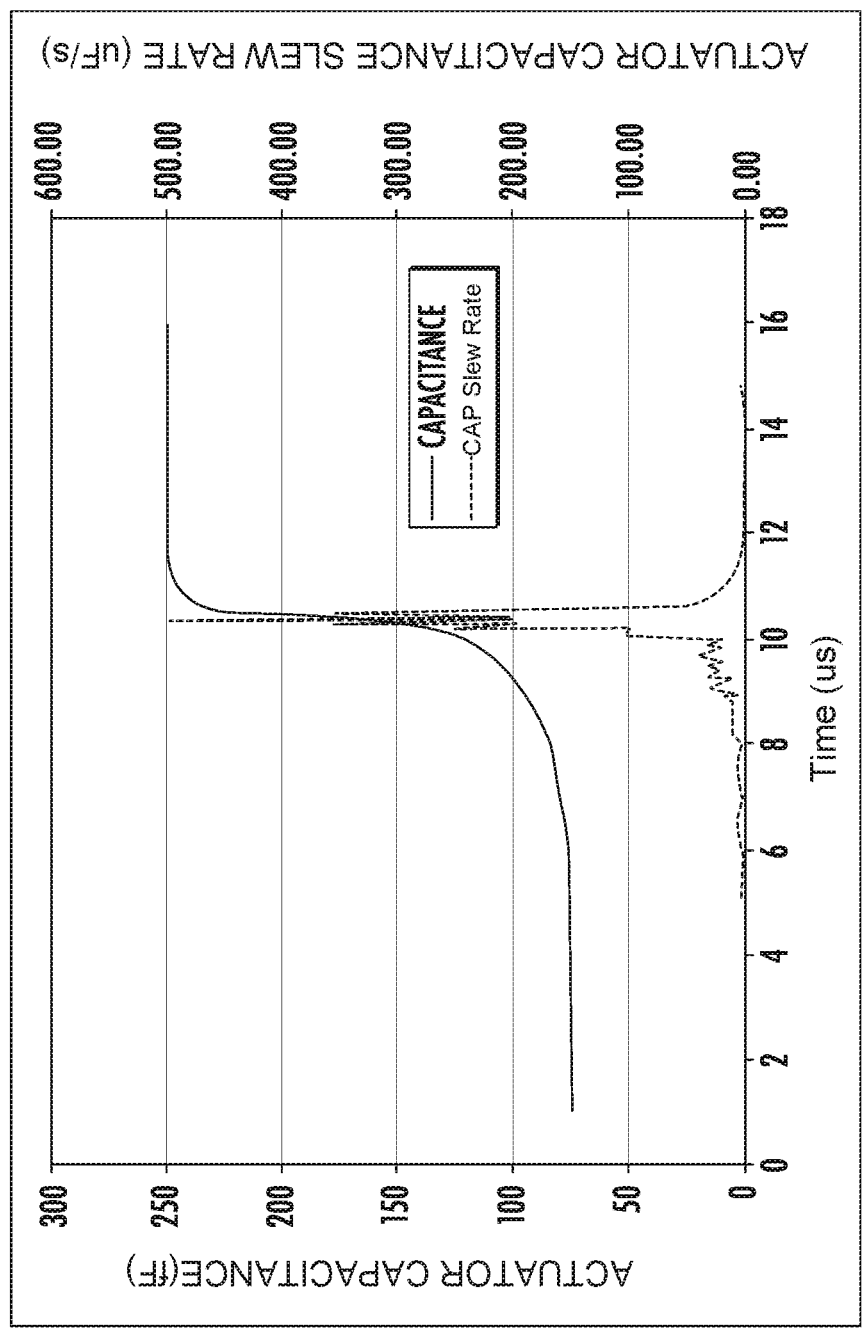
Figure 6C:
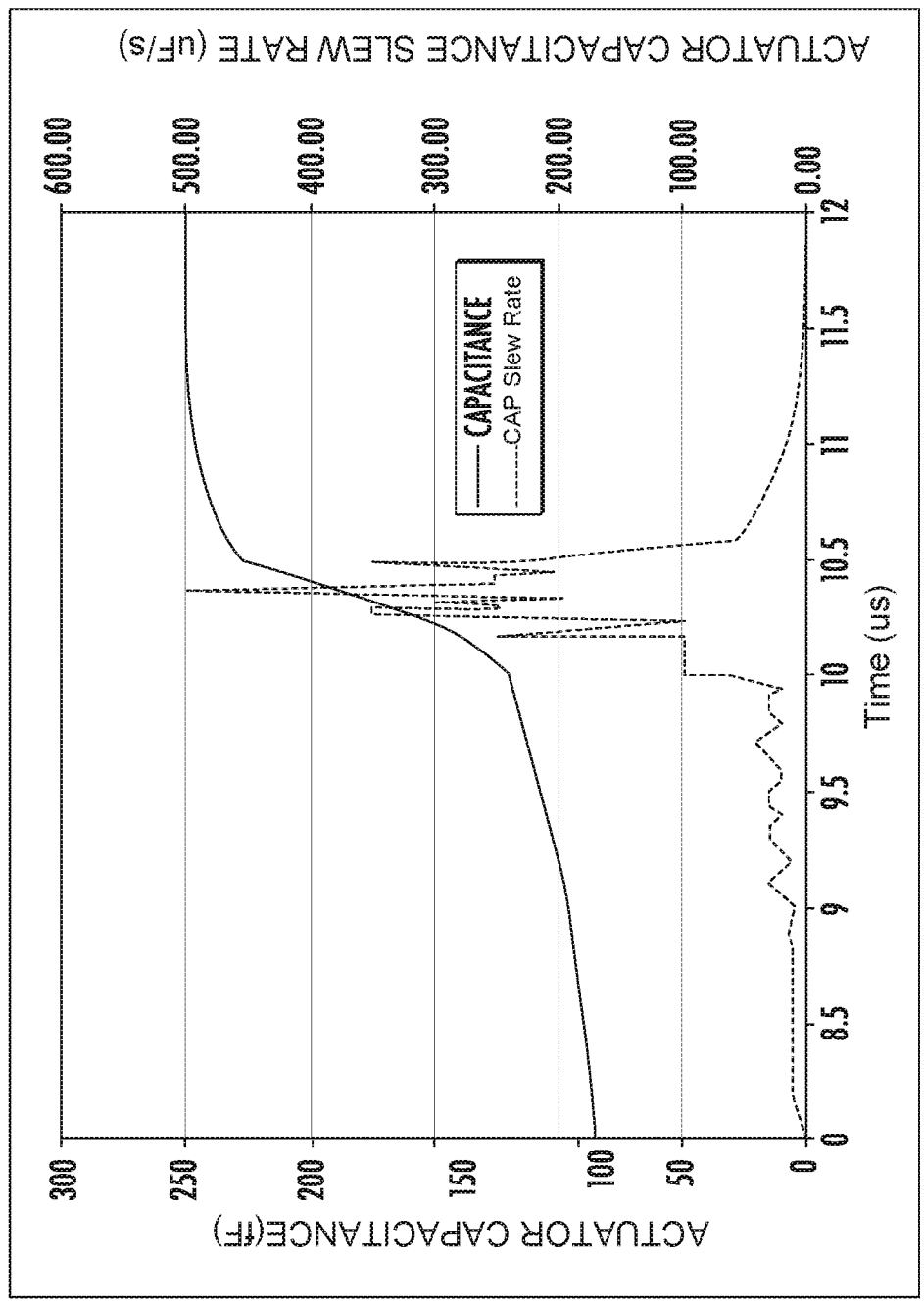

FIG. 6A depicts three charts illustrating various operations of a MEMS device connected to an example driver circuit 100 as described herein. The top plot is the plot of $V_{OUT}$ over time at the MEMS device as it is being charged by the example driver circuit. The middle plot illustrates the dynamic capacitance of the MEMS device as it is charging, i.e., $C_{MEMS}$. And the bottom plot illustrates the voltage being applied to the level shifter input 118. As the voltage to the power supply node 114 ramps up to 40V, the MEMS device begins to charge and the electrodes inside the MEMS get closer together and thus, the middle chart depicting the $C_{MEMS}$ begins to ramp up as well. However, with the slew rate limiting pull-in circuit 104 in place and operating, the rate in change of the capacitance of the MEMs begins to spike at around 10 μs. The capacitance rate of change accelerates to the peak velocity. However, all the velocities during closure and particularly the peak velocity will be lower with the slew-rate limiting pull-in circuit 104 than without it. This phenomenon is also depicted by FIGS. 6B and 6C. FIG. 6C is the same plot as FIG. 6B, but just zoomed in on the time frame between 8 µs and 12 µs. FIGS. 6B and 6C depict the slope of the middle plot of FIG. 6A, i.e., the slope of the change in $C_{MEMS}$. As shown in FIG. 6B, there is a spike in the slope of the $C_{MEMS}$ plot around 10 µs and then the slope begins to decrease significantly as the capacitance of the MEMS reaches its maximum, i.e., the electrodes of the MEMS get very close together or the MEMS closes. It should be noted that the plots depicted in FIGS. 6B and 6C are based on calculations, which have some numerical differentiation noise that would not be present in a real situation.

The present subject matter can be embodied in other forms without departure from the spirit and essential characteristics thereof. The embodiments described therefore are to be considered in all respects as illustrative and not restrictive. Although the present subject matter has been described in terms of certain specific embodiments, other embodiments that are apparent to those of ordinary skill in the art are also within the scope of the present subject matter.

What is claimed is:

1. A driver for an electronic device, the driver comprising:
    a first circuit node;
    a first control circuit;
    one or more first slew rate limiting field-effect transistor (FET) connected between the first circuit node and a node of the electronic device to be driven, wherein a gate of the one or more first slew rate limiting FET is connected to the first control circuit;
    a power supply connected between the first circuit node and a second circuit node; and
    a voltage divider connected between the first circuit node and the second circuit node, wherein the voltage divider is in communication with the power supply and configured to provide a feedback voltage for controlling the power supply,
    wherein the one or more first slew rate limiting FET and the first control circuit are configured to set a rate at which the electronic device is charged or discharged,
    wherein the power supply comprises a charge pump, and wherein the charge pump is configured to be driven until the feedback voltage exceeds a reference feedback voltage, and is configured such that it is not driven when the feedback voltage exceeds the reference feedback voltage;
    wherein the driver further comprising a comparator connected between the voltage divider and the charge pump, the comparator comprising one or more processors, or other suitable circuitry, configured to:
        compare the feedback voltage to the reference feedback voltage; and
        control the charge pump based on a result of comparing the feedback voltage to the reference feedback voltage.

2. The driver of claim 1, wherein the first control circuit comprises:
    one or more diode-connected FETs, wherein a gate of each of the one or more diode-connected FETs is connected to the gate of a corresponding one of the one or more first slew rate limiting FET;
    wherein a source of one of the one or more diode-connected FETs is connected to the first circuit node;
    wherein a drain of one of the one or more diode-connected FETs is common with the gate of the one of the one or more diode-connected FETs;
    wherein the first control circuit is a part of a current source circuit; and
    wherein a current in the current source circuit is mirrored to set a proportional current in the one or more first slew rate limiting FET.

3. The driver of claim 2, wherein the current source circuit comprises:
    the voltage divider.

4. The driver of claim 2, wherein each of the one or more first slew rate limiting FET has a gate width and a gate length that are selected relative to a gate width and gate length, respectively, of the corresponding one of the one or more diode-connected FETs to set a current mirror ratio of the one or more first slew rate limiting FET; and
    wherein a first current flowing through the one or more first slew rate limiting FET is proportional, according to the current mirror ratio, to a second current flowing through the corresponding one of the one or more diode-connected FETs.

5. The driver of claim 4, wherein the electronic device to be driven comprises a micro-electro-mechanical systems (MEMS) actuator; and
    wherein the current mirror ratio is selected to ensure that a rate at which a MEMS actuator capacitance changes over time is below a specified limit.

6. The driver of claim 5, wherein the current mirror ratio is selected to ensure that a time required for the connected MEMS actuator to move from an "OPEN" state to a "CLOSED" state or from a "CLOSED" state to an "OPEN" state is less than a specified maximum switching time.

7. The driver of claim 1, wherein the one or more first slew rate limiting FET comprises two FETs arranged in a series arrangement between the first circuit node or a second circuit node and the electronic device to be driven.

8. The driver of claim 1, further comprising:
    a second control circuit; and
    one or more second slew rate limiting field-effect transistors (FET) connected between the second circuit node and the node of the electronic device to be driven, wherein a gate of the one or more second slew rate limiting FET is connected to the second control circuit;
    wherein the one or more second slew rate limiting FET and second control circuit are configured to set a rate at which the electronic device is charged or discharged.

9. The driver of claim 8, wherein the second control circuit comprises:
    one or more diode-connected FETs, wherein a gate of each of the one or more diode-connected FETs is connected to the gate of a corresponding one of the one or second more slew rate limiting FET;
    wherein a source of one of the one or more diode-connected FETs is connected to the second circuit node;
    wherein a drain of one of the one or more diode-connected FETs is common with the gate of the one of the one or more diode-connected FETs;
    wherein the second control circuit is a part of a current source circuit; and
    wherein a current in the current source circuit is mirrored to set a proportional current in the one or more second slew rate limiting FET.

10. The driver of claim 8, wherein the current source circuit comprises:
    the voltage divider;

wherein the first control circuit and the second control circuit are both a part of the voltage divider.

11. The driver of claim 8, wherein the one or more first slew rate limiting FET comprises a first set of two FETs arranged in a series arrangement and the one or more second slew rate limiting FET comprises a second set of two FETs.

12. The driver of claim 1, wherein the voltage divider is selected from the group consisting of one or more diodes, one or more diode-connected field-effect transistors (FETs), one or more resistors, one or more capacitors, and a combination thereof.

13. A method for controlling a rate at which an electronic device is charged, the method comprising:
applying a voltage to a first circuit node;
connecting one or more first slew rate limiting field-effect transistors (FET) between the first circuit node and a node of the electronic device to be driven;
connecting a gate of the one or more first slew rate limiting FETs to a first control circuit; and
charging or discharging the electronic device through the one or more first slew rate limiting FET using the first control circuit,
wherein the method further comprises:
connecting a power supply between the first circuit node and a second circuit node, wherein the power supply comprises a charge pump;
using a voltage divider to provide a feedback voltage for controlling the power supply, wherein the voltage divider connected between the first circuit node and the second circuit node;
driving the charge pump until the feedback voltage exceeds a reference feedback voltage;
not driving the charge pump when the feedback voltage exceeds the reference feedback voltage;
connecting a comparator between the voltage divider and the charge pump;
comparing the feedback voltage to the reference feedback voltage; and
controlling the charge pump based on a result of comparing the feedback voltage to the reference feedback voltage.

14. The method of claim 13, wherein the first control circuit comprises:
one or more diode-connected FETs, wherein a gate of each of the one or more diode-connected FETs is connected to the gate of a corresponding one of the one or more first slew rate limiting FET;
wherein a source of one of the one or more diode-connected FETs is connected to the first circuit node;
wherein a drain of one of the one or more diode-connected FETs is common with the gate of the one of the one or more diode-connected FETs; and
wherein the first control circuit is a part of a current source circuit, the method further comprising:
mirroring a current in the current source circuit to set a proportional current in the one or more first slew rate limiting FET.

15. The method of claim 14, wherein the current source circuit comprises the voltage divider.

16. The method of claim 14, wherein each of the one or more first slew rate limiting FET has a gate width and a gate length that are selected relative to a gate width and gate length, respectively, of the corresponding one of the one or more diode-connected FETs to set a current mirror ratio of the one or more first slew rate limiting FET; and
wherein a first current flowing through the one or more first slew rate limiting FET is proportional, according to the current mirror ratio, to a second current flowing through the corresponding one of the one or more diode-connected FETs.

17. The method of claim 16, wherein the electronic device to be driven comprises a micro-electro-mechanical systems (MEMS) actuator; and
wherein the current mirror ratio is selected to ensure that a rate at which a MEMS actuator capacitance changes over time is below a specified limit.

18. The method of claim 17, further comprising selecting the current mirror ratio to ensure that a time required for the connected MEMS actuator to move from an "OPEN" state to a "CLOSED" state or from a "CLOSED" state to an "OPEN" state is less than a specified maximum switching time.

19. The method of claim 13, wherein the one or more first slew rate limiting FET comprises two FETs arranged in a series arrangement between the first circuit node or the second circuit node and the electronic device to be driven.

20. The method of claim 13, further comprising:
applying a voltage to the second circuit node;
connecting one or more second slew rate limiting field-effect transistors (FET) between the second circuit node and the node of the electronic device to be driven;
connecting a gate of the one or more second slew rate limiting FET to a second control circuit; and
charging or discharging the electronic device through the one or more second slew rate limiting FET using the second control circuit.

21. The method of claim 20, wherein the second control circuit comprises:
one or more diode-connected FETs, wherein a gate of each of the one or more diode-connected FETs is connected to the gate of a corresponding one of the one or second more slew rate limiting FET;
wherein a source of one of the one or more diode-connected FETs is connected to the second circuit node;
wherein a drain of one of the one or more diode-connected FETs is common with the gate of the one of the one or more diode-connected FETs; and
wherein the second control circuit is a part of a current source circuit, the method further comprising:
mirroring a current in the current source circuit to set a proportional current in the one or more second slew rate limiting FET.

22. The method of claim 20, wherein the current source circuit comprises the voltage divider, wherein the first control circuit and the second control circuit are both a part of the voltage divider.

23. The method of claim 22, wherein the one or more first slew rate limiting FET comprises a first set of two FETs arranged in a series arrangement and the one or more second slew rate limiting FETs comprises a second set of two FETs.

* * * * *